United States Patent [19]

Thomas et al.

[11] 4,081,801

[45] Mar. 28, 1978

[54] ELECTRONIC MEASURING SYSTEM WITH PULSED TRANSDUCER

[75] Inventors: Haydon C. Thomas, Lyndonville; Harry J. Keen, Waterford, both of Vt.

[73] Assignee: Colt Industries Operating Corp., New York, N.Y. N.Y.

[21] Appl. No.: 543,465

[22] Filed: Jan. 23, 1975

[51] Int. Cl.[2] .................... H03K 13/02; G01G 3/14
[52] U.S. Cl. ................ 340/347 AD; 177/DIG. 3; 177/210 R; 307/152; 340/347 M
[58] Field of Search .......................... 177/DIG. 3, 177/210, 211, DIG. 1; 324/99 D, 110, DIG. 1, 133; 340/347 AD, 347 NT, 347 CC; 235/151.3; 335/6; 361/9; 318/116, 118; 310/8.1, 126; 307/152

[56] References Cited

U.S. PATENT DOCUMENTS

| 2,543,680 | 2/1951 | Veevers et al. ............... 324/110 |
| 2,841,746 | 7/1958 | Mawhinney ............... 324/110 UX |
| 3,042,865 | 7/1962 | Stetzler ............... 324/110 |
| 3,130,802 | 4/1964 | Bell ............... 177/DIG. 1 |
| 3,480,949 | 11/1969 | Charbonnier et al. ............... 340/347 NT |
| 3,525,991 | 8/1970 | Kohler ............... 177/211 |
| 3,665,169 | 5/1972 | Henderson et al. ............... 177/25 |
| 3,750,142 | 7/1973 | Barnes et al. ............... 340/347 CC |
| 3,754,126 | 8/1973 | Williams ............... 235/151.33 |
| 3,777,828 | 12/1973 | Dietemeyer ............... 177/DIG. 3 |
| 3,781,869 | 12/1973 | Sudnick et al. ............... 340/347 CC |
| 3,788,410 | 1/1974 | Allenspach et al. ............... 177/211 |
| 3,826,319 | 7/1974 | Loshbough ............... 177/DIG. 1 |
| 3,889,255 | 6/1975 | Pettersen ............... 340/347 CC |
| 3,930,211 | 12/1975 | Belttary ............... 335/6 |
| 3,942,104 | 3/1976 | Byrne ............... 324/30 R |

Primary Examiner—Thomas J. Sloyan
Attorney, Agent, or Firm—Sixbey, Bradford & Leedom

[57] ABSTRACT

The electronic measuring system includes a novel power supply which may receive power from a D.C. or A.C. source but which is particularly adapted to convert D.C. battery power to higher voltage pulses to drive a transducer. During intervals between transducer power pulses, an automatic drift compensation system stores an indication of system drift for use during a subsequent power pulse period. The system includes stability sensing means which render the system inoperative for measurement purposes when the signal from the measuring transducer is unstable. To compensate for a loss of time, the system automatically operates for a short period at a rapid rate subsequent to a period of input signal unstability.

A novel indicator system and indicator control unit is employed wherein up-down counters are controlled in the indicator for rounding purposes. This system is adaptd to round an output indication by ones, twos, or fives, and where fives rounding is accomplished, the system automatically senses whether the rounding is to be up or down to the nearest five indication. Additionally, measurement indication pulses are fed through a divider counter network prior to the indicator to increase the resolution of the measurement displayed by the indicator.

37 Claims, 12 Drawing Figures

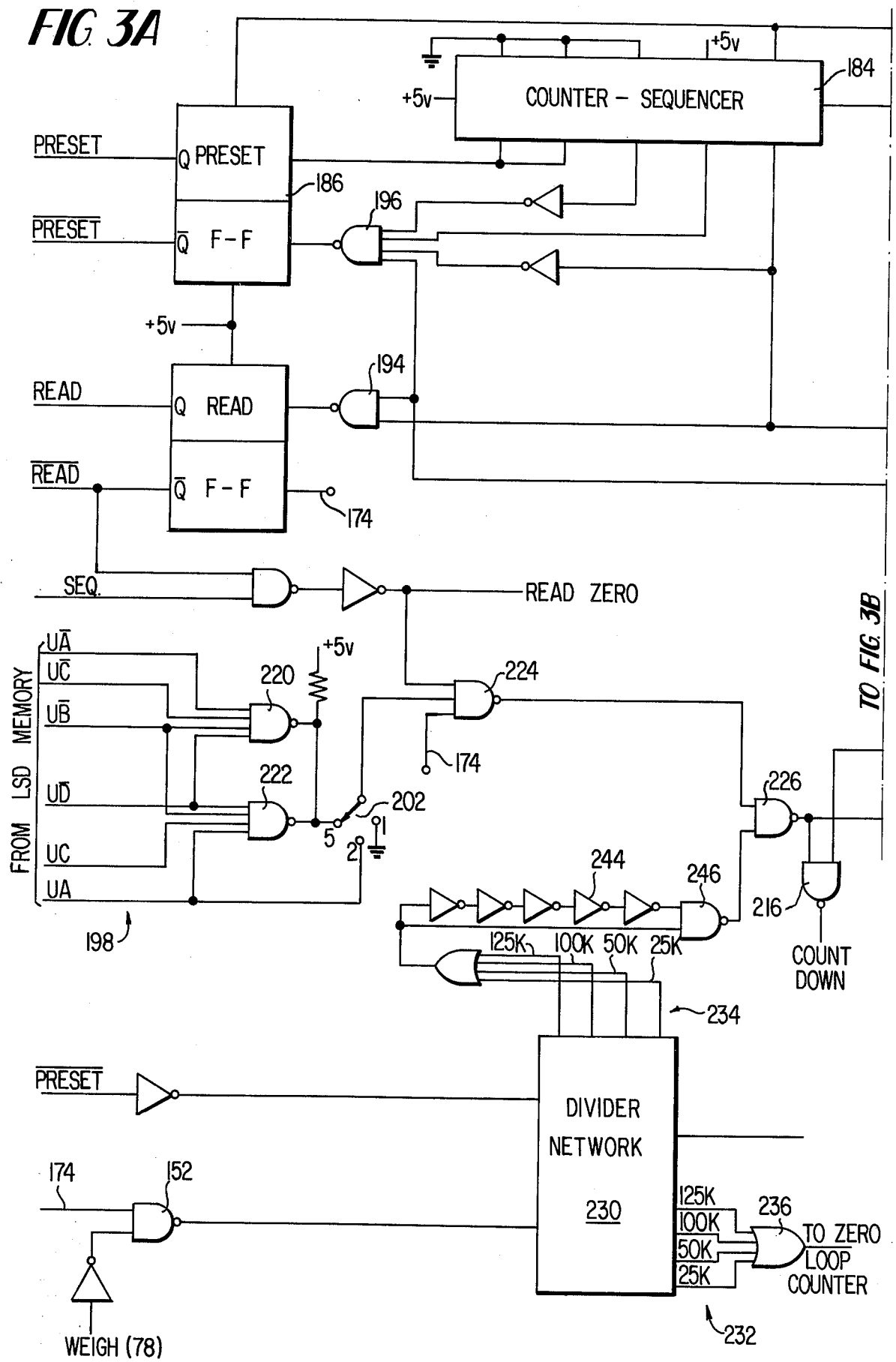

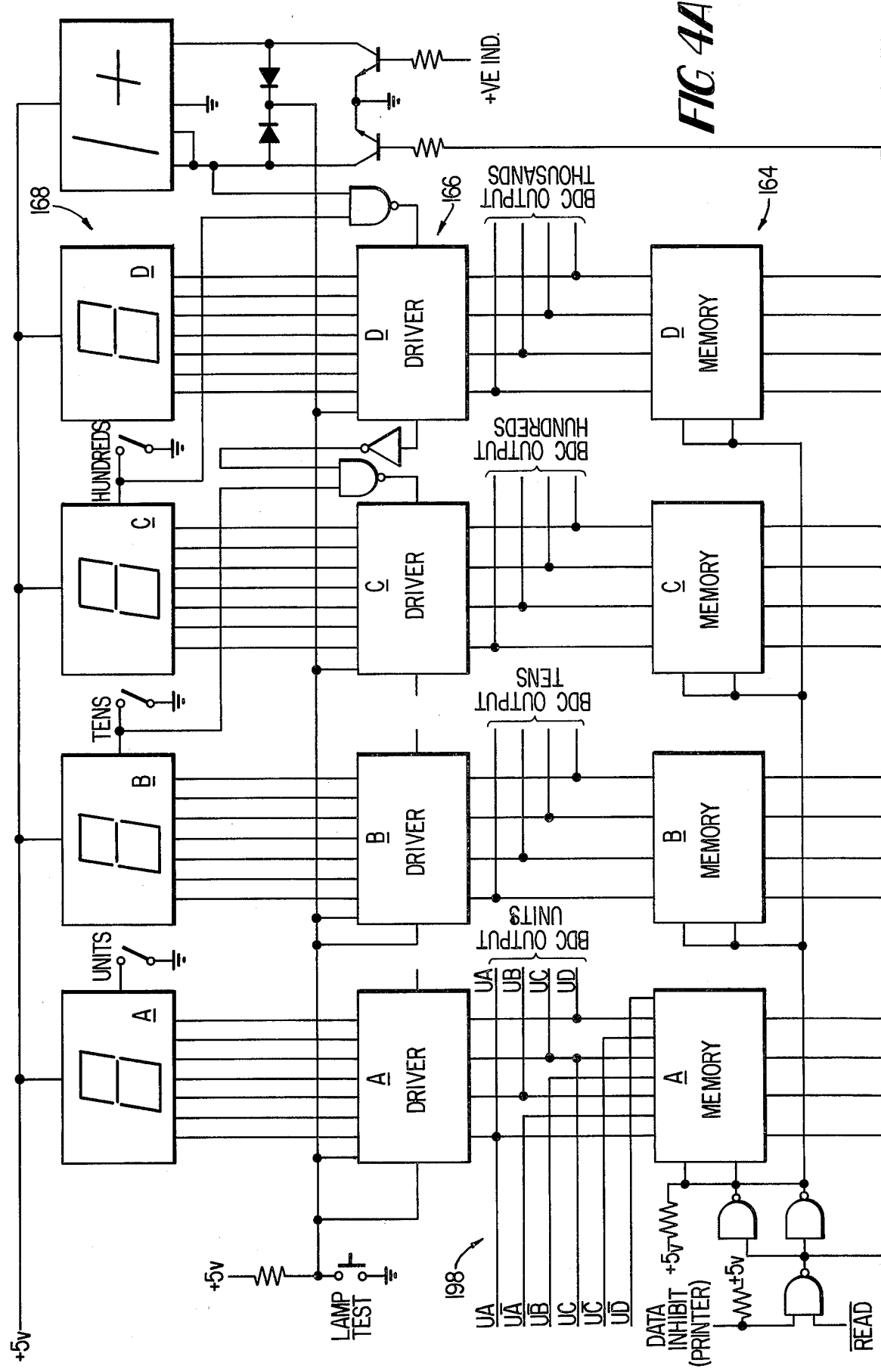

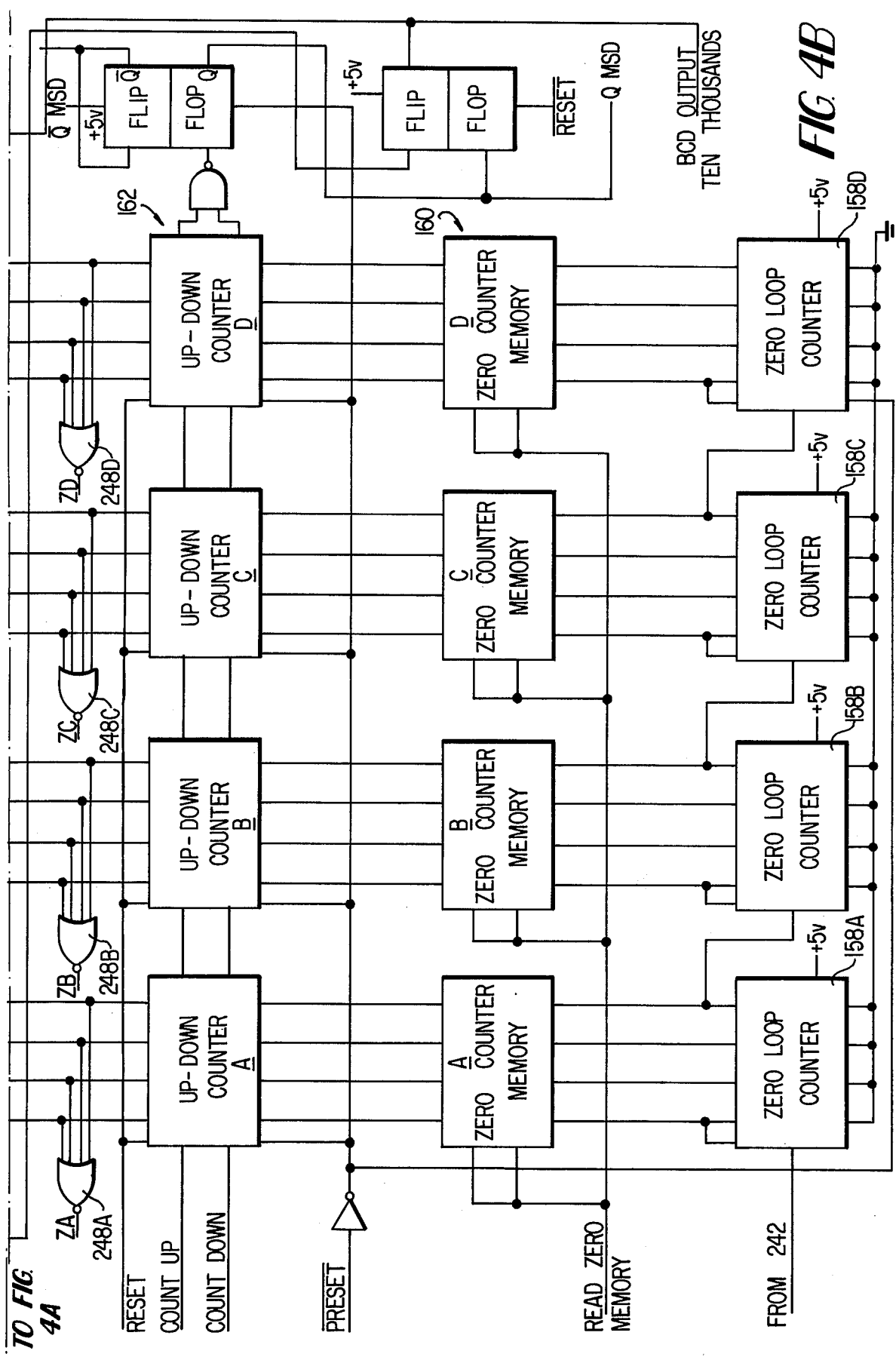

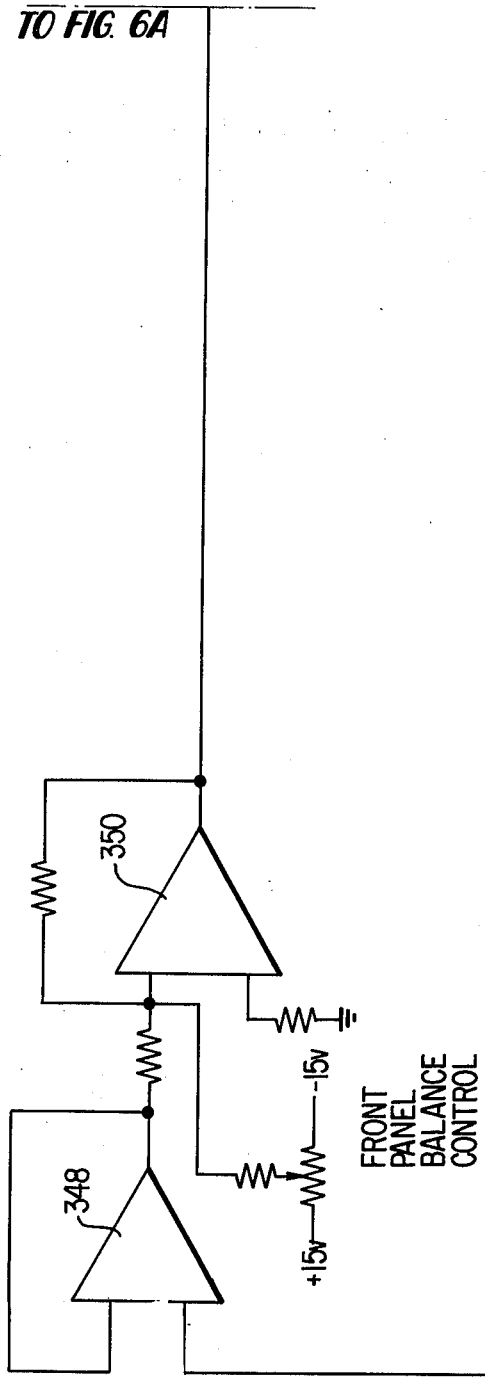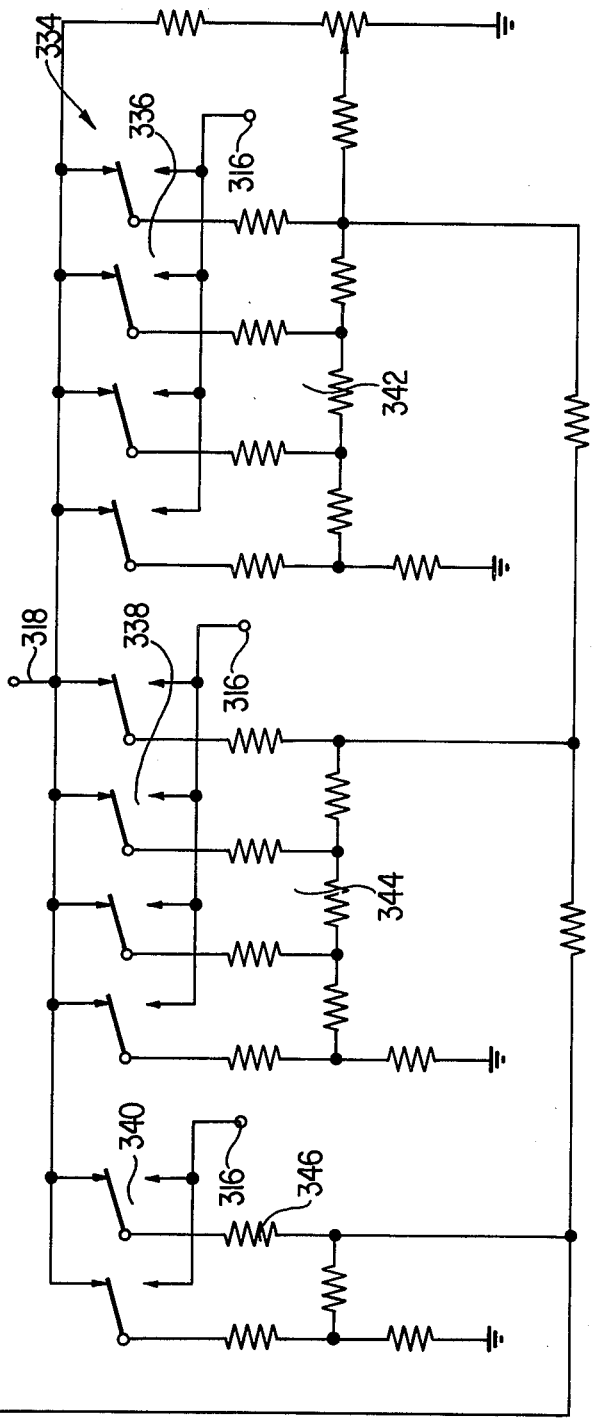
FIG. 6B

ELECTRONIC MEASURING SYSTEM WITH PULSED TRANSDUCER

BACKGROUND OF THE INVENTION

Among the recent developments in electronic technology have been a number of electronic measuring systems capable of providing a digital indication representative of a value to be measured. Many of such systems respond to central sequencers to rapidly provide a plurality of measurements within a very short time so that a relatively accurate measurement indication is obtained. Other systems are capable of combining indications from a number of successive measuring operations to indicate comparative values obtained from successive measurements.

Generally, electronic measuring systems operate from an A.C. power supply and are not adapted for use with a portable instrument. Those systems which do operate from battery power, such as systems for vehicular use, are generally simple systems which do not have the capabilities of the more complex, non portable measuring units. However, there is an increasing demand for electronic measuring units for portable or vehicular use, and particularly for electronic weighing units, such as that disclosed in U.S. Pat. No. 3,650,340 to R. S. Bradley, which may be used in agricultural and similar vehicles. Presently known portable and vehicular weighing systems of the electronic type which operate from battery power generally require an excessive warm-up period and must be deactivated during brief intervals of non use to prevent excessive battery drain. This is due to the fact that such systems draw constant power from the battery supply source.

All electronic measuring systems are subject to drift variations due to temperature, electrical characteristics, mechanical, environmental, and other effects inherent in such systems. In the more complex electronic measuring systems, such as that disclosed by U.S. Pat. No. 3,665,169 to Henderson et al, sophisticated automatic zeroing assemblies are employed to very accurately track zero in the system and compensate for drift. In less sophisticated electronic systems suitable for use in portable instrumentation, drift compensation is often non-existent.

Conventionally, the more complex electronic measuring systems include indicator control units for indicator systems which are adapted to accomplish rounding of the output indication, the use of dividers for a digital measurement signal to provide signal ranging, and the use of up-down counters to arithmetically compute the value of an output indication. For example, the Henderson et al patent previously identified discloses both rounding of the output indication and the use of a counter system to compute the net weight sensed by an electronic weighing system. Although this net weight computation accomplished by the Henderson et al system does not employ up-down counters, the equivalent of up-down counter operation is provided by presetting the complement of a tare value into a counter system and subsequently counting out this tare value with a gross weight to achieve a net weight indication.

Similarly, the use of up-down counters in an electronic weighing system to count out a preset tare and to then provide a net weight indication from a gross weight input is disclosed by U.S. Pat. Nos. 3,788,410 to Allenspach et al and 3,777,828 to Dietemeyer. Both of these patented systems employ conventional absolute value indicating up-down counters of the type shown by U.S. Pat. Nos. 2,970,759 to Lanning, 3,159,792 to Metz, and 3,272,971 to Klenikowski. The absolute value up-down counter is particularly well adapted for tare calculations in an electronic weighing system, for such counters are designed to count toward zero in response to pulses in an input pulse train for counting the counter down from an initial count toward zero or a predetermined minimum count. When the counter registers zero or the mininum count, this condition is sensed and the counter is caused to count up from zero or the minimum count with any remaining pulses in the input pulse train.

The use of a divider stage between a counter and indicator system and an analog to digital conversion system is illustrated by U.S. Pat. No. 3,258,764 to Muniz et al. This divider stage may be employed to divide the pulse output from the measuring system down to a range acceptable in a counter and indicator assembly for the system. Should it become desirable to selectively vary the range of the weighing system by a predetermined factor, a variable divider of the type shown by U.S. Pat. No. 3,147,442 to Fritzsche et al is used.

Ideally, an electronic system employed in a small or portable measuring unit for weighing or similar applications should incorporate the features conventional to the more complex electronic measuring systems.

It is the primary object of the present invention to provide a novel and improved electronic measuring system adapted to operate from either battery power or a conventional A.C. power supply.

Another object of the present invention is to provide a novel and improved electronic measuring system which is operative from a conventional battery power supply, which requires a minimum warm-up period and which may be continuously run with minimum drain on the battery.

A further object of the present invention is to provide a novel and improved electronic measuring system incorporating a power supply unit which provides pulsed power to a transducer for the system.

Another object of the present invention is to provide a novel and improved electronic measuring system incorporating a power supply which provides pulsed power to a transducer for the system and a drift compensation unit which operates during intervals between said transducer power pulses to sense system drift.

Another object of the present invention is to provide a novel and improved electronic measuring system which includes an instability sensing assembly responsive to an unstable input measurement signal for preventing measurement during the period of instability.

A further object of the present invention is to provide a novel and improved electronic measuring system which includes an instablity sensing assembly operative to prevent the occurrence of a measurement during periods of instability of the input measurement signal and which operates for a short period after a period of instability to cause the system to rapidly accomplish a plurality of measurements at a repetition rate higher than the normal measurement repetition rate.

Another object of the present invention is to provide a novel and improved electronic measuring system which includes a divider counter network in combination with an indicator assembly to increase the resolution of the indications displayed.

A further object of the present invention is to provide a novel and improved electronic measuring system incorporating an indicator system adapted to accomplish tare compensation, output indication round off and the comparison of successive measurements.

A still further object of the present invention is to provide a novel and improved electronic measuring system adapted to round off an output indication by ones, twos, or fives and to automatically sense whether a round off in fives should be up or down.

These and other objects of the present invention will be apparent from a consideration of the following specification and claims taken in conjunction with the accompanying drawings in which:

FIGS. 4 (A & B) is a block diagram of the counter and indicator unit of FIG. 2;

Figure 1A:
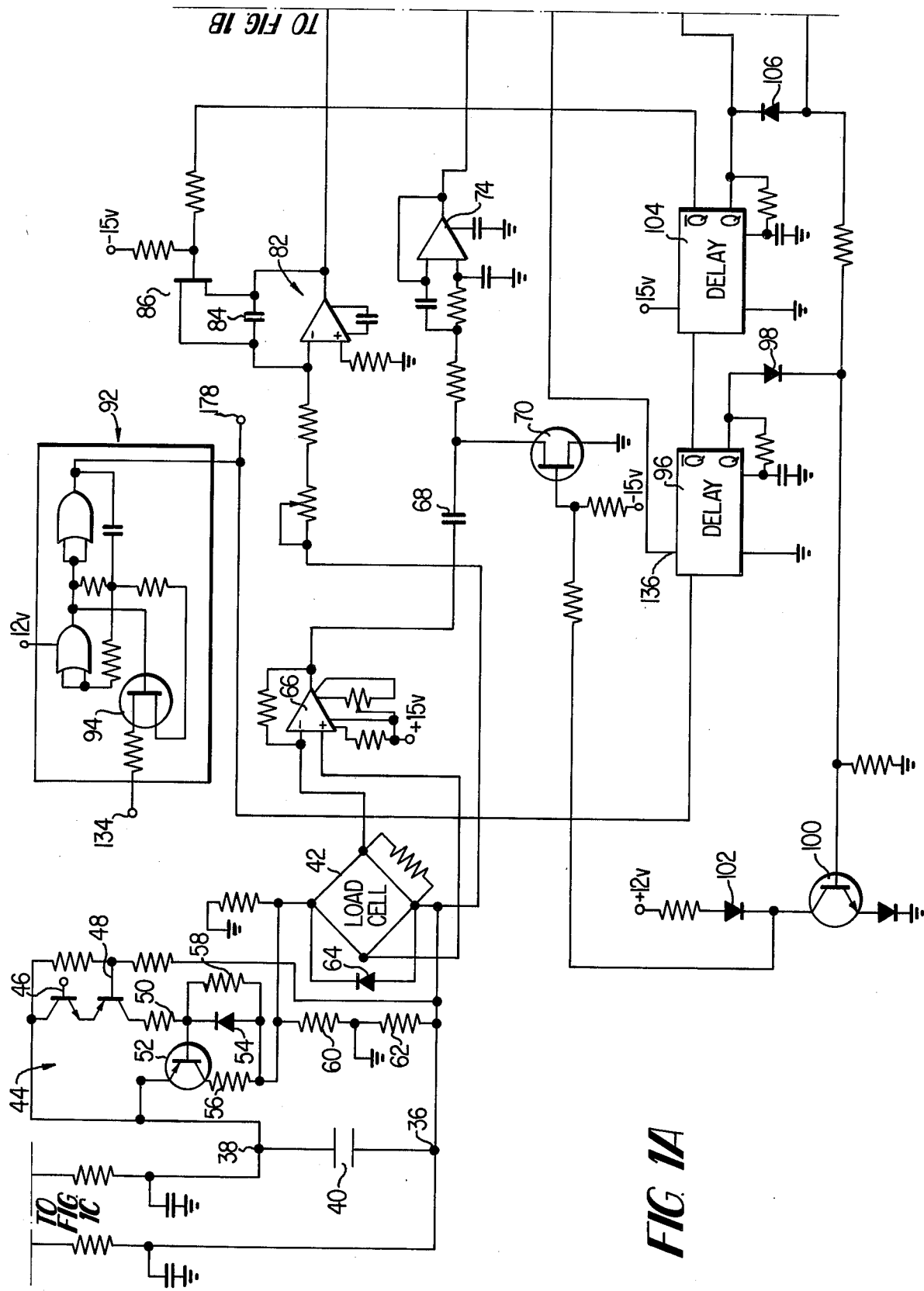
FIGS. 1 (A–C) is a circuit diagram of an electronic measuring unit of the present invention.
Figure 1B:
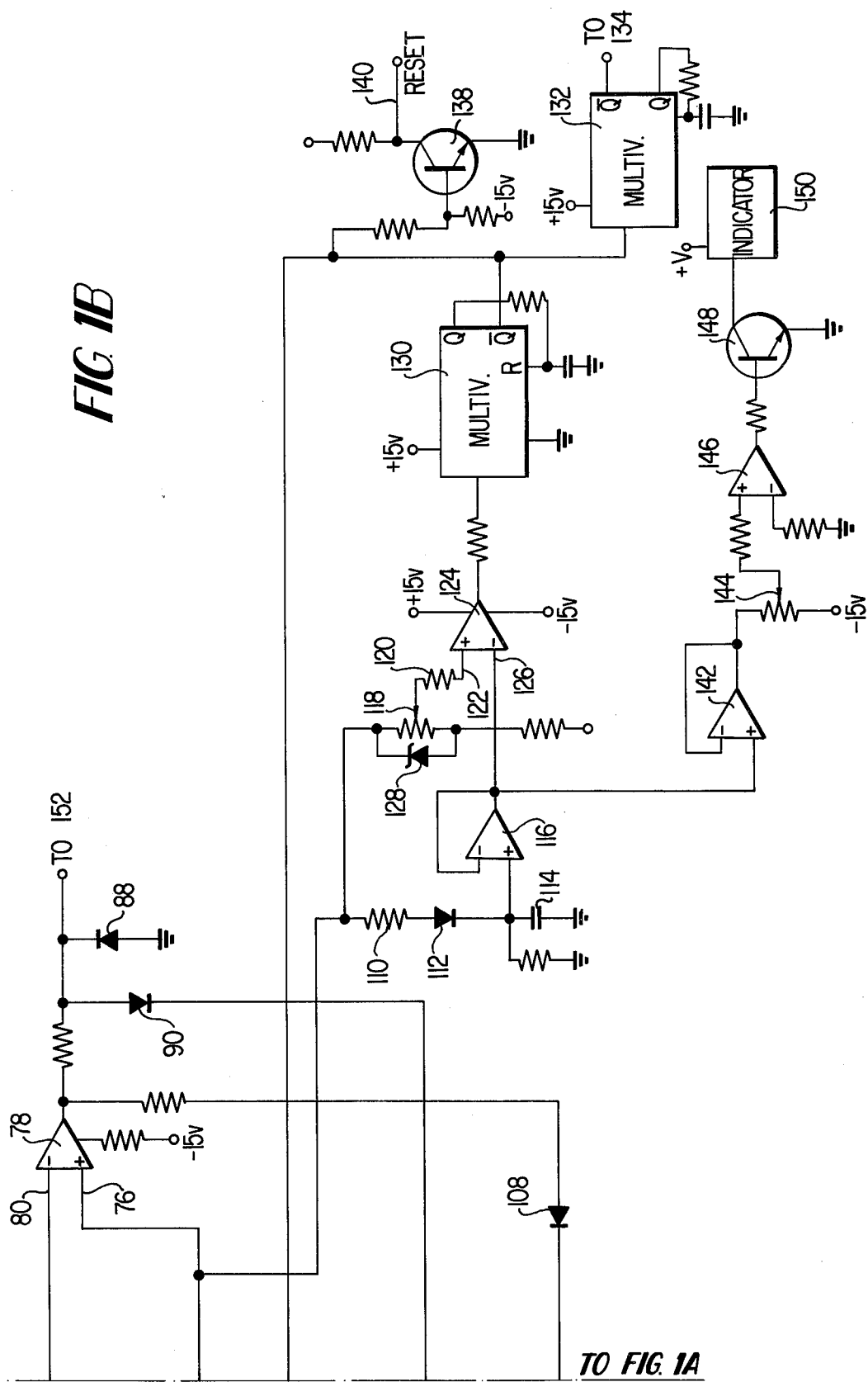

FIG. 1 provides an illustration of the basic electronic circuitry employed in the electronic measuring unit 10 of the present invention. For purposes of illustration, the basic power supply to this circuit is shown as a 12 volt battery, and the circuit is designed to operate from such a battery power supply. All 12 volt inputs to the measuring circuit are provided directly from this battery, but obviously a normal 120 volt 60 cycle A.C. power supply with conventional conversion units may also be employed to power the electronic measuring unit.

Figure 1C:
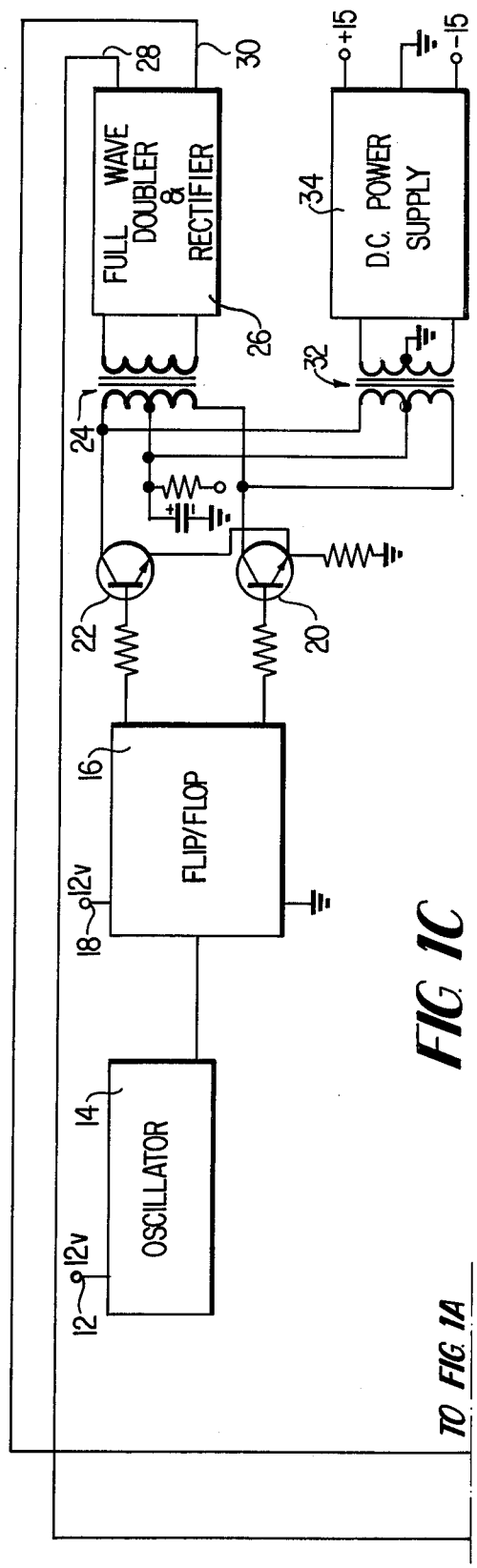

Referring to FIG. 1C, a 12 volt input 12 from a battery unit is connected to an oscillator 14. This battery driven oscillator provides output pulses to a flip flop unit 16 which also receives battery power through an input 18. The flip flop unit operates to convert the pulse output from the oscillator into positive and negative going square waves which are fed respectively to the base electrodes of power driver transistors 20 and 22. The outputs from the power driver transistors are directed across a first transformer 24 for a full wave doubler and rectifier unit 26, this full wave doubler and rectifier unit providing a stepped up D.C. output across output lines 28 and 30. For example, this D.C. output may be an 80 volt output.

Also the outputs of the power drivers 20 and 22 are provided to a second transformer 32 for a D.C. power supply 34. This D.C. power supply constitutes a conventional analog power supply for the electronic measuring unit 10 and includes rectifier and conversion means to provide a plus 15 volt and minus 15 volt D.C. output symmetrical about ground. Obviously, a conventional 120 volt, 60 cycle A.C. power supply could be rectified and converted in a known manner to provide the outputs desired across the lines 28 and 30 and to provide the output from the D.C. power supply 34. The output from the full wave doubler and rectifier 26 appears at terminals 36 and 38 (FIG. 1A) and thus across a floating capacitor 40. Terminal 36 is also connected to one terminal of a load cell bridge 42, while terminal 38 is connected to a power control circuit 44 for the load cell bridge which includes the conventional load variable resistances of a conventional load cell. Obviously, other transducer inputs to the electronic measuring unit 10 might be employed, but for illustrative purposes, the input will be described as originating from a weight responsive load cell.

The power control circuit 44 is operative in response to the conduction of a photo-transistor 46 which operates as an on-off switch. When the photo-transistor 46 conducts, power from the terminal 38 is provided across a transistor 48 and a base resistor 50 to initiate conduction of a transistor 52. The transistor 52 with a Zener diode 54 and resistors 56 and 58 forms a constant current power supply for the load cell bridge 42. The constant current power supply will provide current to the load cell bridge for a time determined by the conduction of the photo-transistor 46. This current is provided to the load cell bridge across a voltage divider consisting of resistors 60 and 62 so that the current to the load cell bridge is symmetrical about ground. Protection for the load cell bridge is provided by a Zener diode 64 connected across the power inputs to the bridge.

Upon receipt of power from the power control section 44, the load cell bridge 42 will operate in the conventional manner to generate an analog output signal indicative of the magnitude of the load applied to a load cell (not shown). This analog output signal is amplified by an amplifier 66 and is then applied to an automatic drift correction circuit consisting of a capacitor 68, field effect transistor circuit 70, a resistor 72 and a filter amplifier 74 which constitutes a low pass filter and an operational amplifier follower. The automatic drift correction circuit operates in a manner to be subsequently described to store on the capacitor 68 a drift signal when the photo-transistor 46 is non-conductive and therefore no output is provided from the load cell bridge 42. This drift signal is indicative of the amount that the system has varied from zero by reason of drift or other system variations, and is stored on the capacitor 68 due to the conduction of the field effect transistor 70 during periods when no output is provided by the load cell bridge. Subsequent non-conduction of the field effect transistor during periods when an output from the load cell bridge is provided through the amplifier 66 results in the amplifier output being, in effect, corrected by the voltage magnitude stored by the capacitor 68 to provide a true zero for the system.

The correct amplified load cell output passes across the capacitor 68 and through the filter amplifier 74 to a first input 76 for a comparator 78. (FIG. 1B) A linearly increasing ramp signal is provided to a second input 80 for the comparator from a ramp generator 82. This ramp generator constitutes a conventional integrator type ramp generator with the exception that a feedback capacitor 84 for the ramp generator is shunted by a field effect transistor 86. This field effect transistor, when conducting, shorts out the capacitor 84 to place a feedback of unity across the ramp generator and thus provides an accurate and effective zero reference for the beginning of the ramp. This operation of the field effect transistor 86 in providing an effective zero for the ramp eliminates the necessity to provide start and stop comparators now conventionally employed in analog to digital conversion systems to establish an effective zero or start point for the ramp measurement. Since the ramp from the ramp generator 82 will now begin at an accurate zero point established by previous conduction of the field effect transistor 86, only one comparator 78 is required for the system. The output from this comparator is a positive clamped pulse which terminates when the linearly increasing ramp signal from the ramp generator 82 reaches the magnitude of the analog signal at the input 76. This signal is present at a terminal which goes to a conventional gate or flip flop connected to pass an oscillator signal to an indicator between the time the ramp signal is initiated and the time that an output is provided by the comparator 78. The comparator output signal is clamped positive by a diode 88, and any noise signals are filtered therefrom by a diode 90 which passes the noise signals to ground.

Power is provided to the load cell bridge 42 from the power control circuit 44 in response to control pulses generated by a control pulse source 92. This control pulse source constitutes any suitable two speed oscillator adapted to provide constant frequency pulses at either a first frequency or a second higher frequency depending upon the state of a field effect transistor 94. These pulses are fed to a delay unit 96 which is, in fact, a delay multivibrator having a normally positive signal on a $\overline{Q}$ output thereof and a normally negative signal on a Q output thereof. Thus, upon receipt of a pulse from the control pulse source 92, the $\overline{Q}$ output of the multivibrator 96 goes negative while the Q output thereof goes positive. This positive output across the diode 98 causes conduction of a transistor 100 and therefore conduction and illumination of a photo-diode 102. Illumination of this photo-diode results in the conduction of the photo-transistor 46 and the provision of power to the load cell bridge 42. Also, conduction of the transistor 100 causes the bias at the base of the field effect transistor 70 to drop, and the field effect transistor is thereby caused to cease conduction.

The negative pulse from the $\overline{Q}$ output of the delay multivibrator 96 is fed to the input of a second delay multivibrator 104. This delay multivibrator includes a $\overline{Q}$ output which is normally positive and a $\overline{Q}$ output which is normally negative. Shortly after the receipt of the negative pulse from the output of the delay multivibrator 96, the delay multivibrator 104 provides a negative output pulse from the $\overline{Q}$ output thereof to terminate the conduction of the field effect transistor 86 and thereby initiate the generation of a ramp signal by the ramp generator 82. This initiation of the ramp signal is delayed sufficiently by the delay multivibrator 104 to give the power control section 44 time to provide power to the load cell bridge 42 and for this input power to have become stabilized. Also, the Q output of the delay multivibrator 104 goes positive when the Q output thereof goes negative, and this positive signal across a diode 106 maintains conduction of the transistor 100 when the pulse from the control pulse source 92 is no longer present at the input to the delay multivibrator 96. However, the output from the comparator 78, which occurs when the ramp signal on the input 80 thereof equals in magnitude the analog signal on the input 76 thereof, passes across a diode 108 to terminate conduction of the transistor 100 and thereby extinguish the photodiode 102. Should the comparator 78 malfunction and not provide an output signal, the transistor 100 will ultimately be caused to cease conduction by the delay multivibrator 104 which constitutes a monostable multivibrator and will, after a predetermined time, switch back to an initial state. Once the transistor 100 ceases to conduct, a positive bias is applied to the base of the field effect transistor 70 and the field effect transistor will begin to conduct, thereby causing the capacitor 68 to charge to a vaue indicative of any signal present in the system with the load cell bridge 42 in a no power condition. Also, the delay multivibrator 104 will change state between pulses from the control pulse source 92 to reinitiate conduction of the field effect transistor 86 and shunt the capacitor 84, thereby establishing an accurate zero for the ramp generator.

The control pulse source 92 will provide pulses having a frequency which is such that sufficient time is provided between pulses for the delay multivibrators 96 and 104 to automatically reset. Also, sufficient time is provided between pulses for the ramp signal from the ramp generator to build to the magnitude of any load signal at the input 76 of the comparator 78. For example, the control pulse source may provide 16 pulses per second at the first frequency thereof and 32 pulses per second at the second frequency. It is important to note that the power control system 44 provides power to the load cell bridge 42 for a duration which extends only from the time the transistor 102 is triggered into conduction by the delay multivibrator 96 until the transistor ceases conduction under control of the output from the comparator 78 or in response to the delay multivibrator 104 returning to the initial state. Obviously, the delay multivibrator 104 will not return to an initial state until after a time period has elapsed which exceeds the maximum time required for the ramp signal to reach the magnitude of the analog input signal to the comparator 78. Also, this intermittent operation of the power control system 44 in response to conduction of the photo-transistor 46 results in pulses of power being supplied to the load cell bridge 42. This pulsing of the load cell bridge permits much higher voltages to be used in the power supply than could normally be used if the load cell bridge were continuously supplied with a voltage of this magnitude. Thus higher load cell outputs can be provided with lower capacity load cells than would normally be used with a constant supply of power of the magnitude provided by the power control system 44.

Briefly summarizing the basic normal operation of the circuit of FIG. 1, before a control pulse is applied from the control pulse source 92 to the input of the delay multivibrator 96, the transistor 100 is non-conductive, the photo-diode 102 is non-conductive, and therefore the photo-transistor 46 is non-conductive. Thus, no input pwoer is supplied by the control power source 44 to the load cell bridge 42. However, the field effect transistor 70 is conductive and therefore a voltage indicative of system variations away from absolute zero is developed and stored in the capacitor 68. Also, the field effect transistor 86 is conductive to establish an absolute zero for the ramp generator 82.

With an applied load present, a control pulse from the control pulse source 92 causes the delay multivibrator 96 to change state and trigger conduction of the transistor 100. This terminates conduction of the field effect transistor 140 and initiates conduction of the photo diode 116 so that power is applied to the load cell 112. Since the filter amplifier 74 provides an infinite resistance to the discharge of the capacitor 68 during the period when no power is provided to the load cell bridge 42, there is no leakage from the capacitor which accurately stores a voltage equal to the magnitude of the system drift voltage. This infinite resistance remains initially for a short period after the field effect transistor 70 ceases to conduct and power is applied to the load cell bridge 42, and since the infinite resistance prevents capacitor leakage, the capacitor 68 will pass only the output analog signal from the load cell bridge. It is this analog signal unaffected by system drift which is compared with the ramp signal in the comparator 78.

After a slight delay period, the delay multivibrator 104 terminates conduction of the field effect transistor 86 and the ramp generator 82 provides a linearly increasing ramp signal to the input 80 of the comparator 78. Additionally, the delay multivibrator 104 maintains conduction of the transistor 100 after the initiation pulse from the control pulse source 92 has been terminated. Once the linearly increasing ramp signal reaches the magnitude of the analog input signal, the output from the comparator 78 terminates conduction of the transistor 100, thereby removing power from the load cell bridge 42 and reinitiating conduction of the field effect transistor 70. Shortly thereafter, the delay multivibrator 104 returns to its initial state and reinitiates conduction of the field effect transistor 86.

With conventional measuring units for force measuring, oscillations affecting the force applied to the transducer result in erroneous output indications. For example, if a conventional electronic or mechanical weighing scale is placed on a vibrating platform, the output indication will vary constantly with variations in the intensity of vibration. The electronic measuring unit 10, when used with a force measuring transducer such as a load cell, will provide no output indication when the input signal from the load cell bridge varies rapidly, as in response to vibration. The unit will respond to gradual increases or decreases in the input signal, but radical changes cause the system to automatically shut down until the signal settles.

The analog signal at the output of the filter amplifier 74 is passed across a resistor 110 and through a diode 112 to charge a capacitor 114. (FIG. 1B) The resistor integrates and slightly delays the charging signal, while an operational follower amplifier 116 prevents capacitor discharge. The analog signal is also developed across a variable potentiometer 118 and is fed by means of an input resistor 120 to the positive input 122 of an operational amplifier 124. The negative input 126 of the operational amplifier is connected to the output of the operational follower amplifier 116.

A zener diode 128 shunts the potentiometer 118 and, for a relatively stable condition of the input analog signal, maintains the voltage on the input 122 at a slightly lower level than the voltage on the input 126 from the charging capacitor 114. This input voltage relationship is maintained when the analog signal is stable or slowly varying, and the operational amplifier 124 provides a negative input signal to a monostable multivibrator 130. A $\overline{Q}$ output from the monostable multivibrator 130 provides a positive output in response to the negative input signal from the operational amplifier, and this positive output causes the $\overline{Q}$ output of a second monostable multivibrator 132 to go negative. This negative output is connected to a terminal 134 for the control pulse source 92 and prevents conduction of the field effect transistor 94 so that output pulses of the lower frequency (16 pulses per second) are provided by the control pulse source to the delay multivibrator 96. The positive output from the multivibrator 130 also provides a positive voltage at a supply terminal 136 for the delay multivibrator 96 to permit operation of the delay multivibrator and a positive signal at the base of a reset transistor 138 to cause conduction of the transistor.

Now, if the input analog signal rises rapidly in response to the initial application of a load to a load cell transducer or in response to vibration or other external influences, it is desirable to automatically terminate the operation of the electronic measuring unit 10 until the analog signal becomes substantially stable. A rapid rise in the analog signal counteracts the normal effect of the Zener diode 128 and causes the input 122 of the operational amplifier 124 to become positive with respect to the input 126. The resistor 110 and diode 112 prevent the capacitor 114 from charging at a rate sufficient to allow the voltage at the input 126 to lead or exceed that at the input 122, and the operational amplifier now provides a positive input to the multivibrator 130. The $\overline{Q}$ output of this multivibrator now goes negative causing the input 136 of the delay multivibrator 96 to go negative and thereby preventing operation of the delay multivibrator even though input signals are received from the control pulse source 92. Thus operation of the electronic measuring unti 10 is prevented when a rapidly changing analog signal is sensed at the operational amplifier 124.

A negative output from the multivibrator 130 causes the transistor 138 to cease conduction and provide a reset signal on a terminal 140 which may be employed to reset a suitable counter system connected to the electronic measuring unit. Also, the negative output from the multivibrator 130 provides a negative input to the multivibrator 132, and the $\overline{Q}$ output thereof now goes positive to cause conduction of the field effect transistor 94. This switches the control pulse source 92 to the high frequency state, and control pulses at, for example, 32 pulses per second are fed to the input of the delay multivibrator 96. Since the delay multivibrator is inoperative due to the negative signal at the input 136, these pulses have no effect.

The high frequency pulses from the control pulse source 92 are effective for an initial measuring period after the analog input signal to the electronic measuring unit 10 has stabilized. When a load is applied to a load cell for the load cell bridge 42, the rapid rise in the analog signal causes the electronic measuring unit to remain inoperative. However, as the load stabilizes, so does the analog signal, and when the analog signal ceases to rise rapidly, the voltage at the input 126 exceeds that at the input 122. This results in a negative output from the operational amplifier 124 which causes the $\overline{Q}$ output from the multivibrator 130 to go positive and activate the delay multivibrator 136. The delay multivibrator 136 will now receive the high frequency pulses from the control pulse source 92 until the multivibrator 132 changes state and reinitiates the low frequency operation of the control pulse source.

The positive signal at the $\overline{Q}$ output of the multivibrator 130 also causes the multivibrator 132 to change state and switch the control pulse source 92 to the low frequency state, but the multivibrator 132 is a delay multivibrator, and the $\overline{Q}$ output thereof goes negative a short time after the positive input signal is received. This delay gives the control pulse source time to provide a number of high frequency pulses to the delay multivibrator 96.

The novel two speed operation of the control pulse source 92 greatly enhances the response of the electronic measuring unit 10. The system completes a measurement in response to each output pulse from the control pulse source, and normally, with a stable analog input signal, the low frequency state of the control pulse source (i.e., 16 pulses per second) provides enough measurements for a very accurate output indication. However, after a period of analog signal instability, the low frequency operation of the control pulse source will appreciably slow the response of the unit. For example, if the electronic measuring unit 10 is used with a weighing system, the initial application of a load to the weigh platform and load cell will cause the input analog signal to vary rapidly, and the delay multivibrator 96 will be held off. If the control pulse source is limited to only low frequency operation, it will be necessary to wait until the analog signal settles and then for up to an additional second before an accurate output indication is obtained. The high frequency operation of the control pulse source for a short period after the analog signal stabilizies causes a number of measurements to be rapidly taken by the electronic measuring unit, and therefore an accurate output indication is rapidly obtained. Often, the period required for the analog signal to stabilize and an accurate indication to occur in response to the high frequency pulses from the control pulse source will be no longer than the normal response time of the unit during low frequency operation.

The electronic measuring unit 10 may be provided with an over capacity indicator circuit which indicates when the value of the entity being measured is above the rated capacity of the unit. This indicator circuit is particularly useful when the system is used for force measuring applications, and includes a sense amplifier 142 connected to receive the signal from the output of the operational follower 116. This operational follower output signal has an amplitude which is directly related to the amplitude of the input analog signal which charges the capacitor 114. A potentiometer 144 connected to the output of the sense amplifier 142 sets the value at which the output signal from the sense amplifier through an amplifier 146 causes conduction of a transistor 148. Normally, the potentiometer might be set so that an analog input signal to the electronic measuring unti 10 which is 150% of the unit capacity will cause conduction of the transistor 148 and activation of a suitable indicator or over capacity alarm 150.

Figure 2:
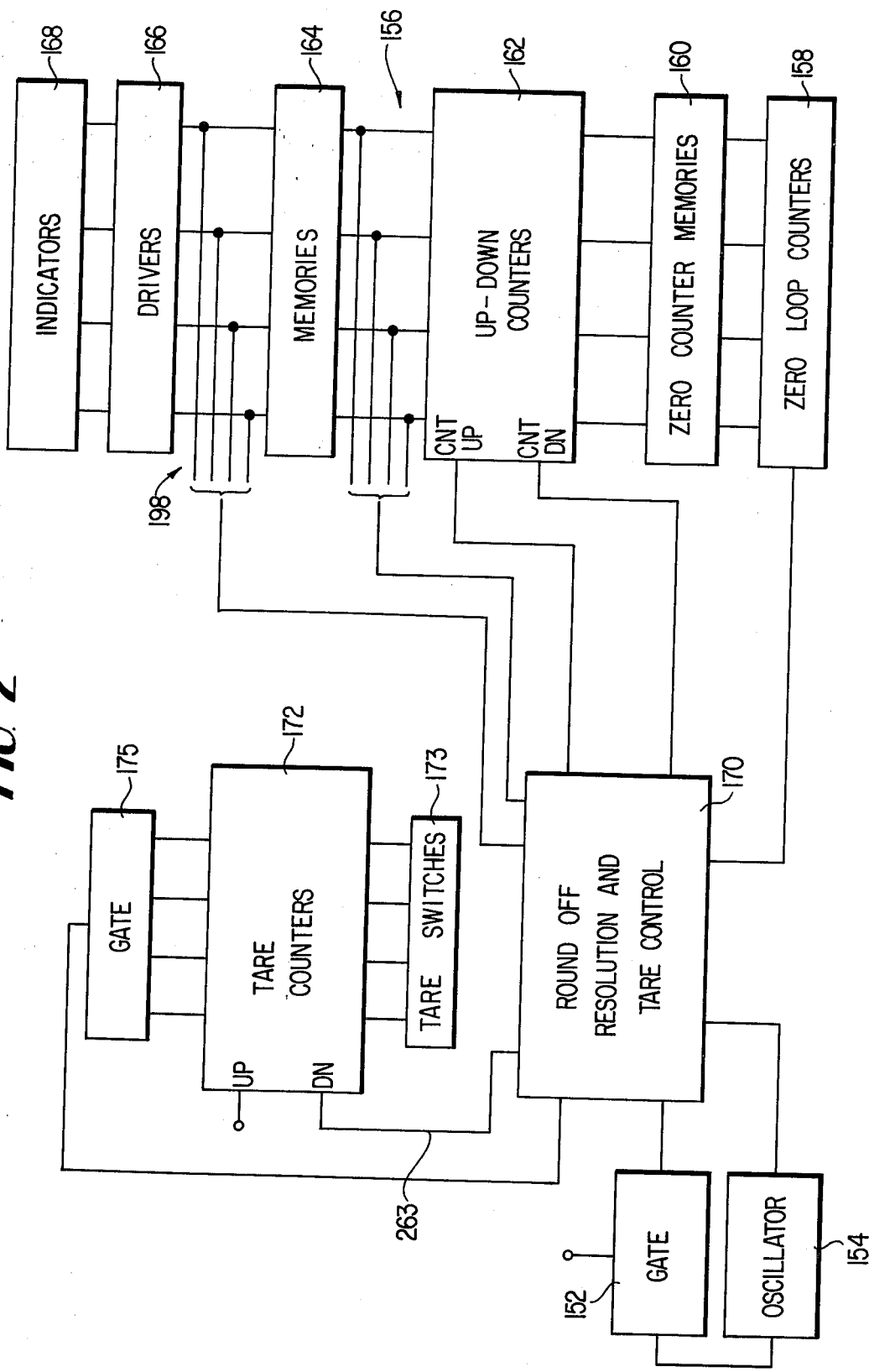
FIG. 2 is a block diagram of the counter and indicator unit and control assembly therefor which is incorporated in the electronic measuring unit of the present invention.

Referring now to FIG. 2, the output from the comparator 78 of FIG. 1 may be fed, as previously indicated, to control a gate 152 in known manner to cause the gate to pass pulses from an oscillator 154 during the period that the ramp from the ramp generator 82 is building to the magnitude of the analog signal on the input 76 of the comparator. At the beginning of the ramp, the gate 152 opens to pass pulses from the oscillator 154 until the ramp reaches a coincidence point with the analog input voltage. At this point, the comparator output changes state and the gate 152 closes to block pulses from the oscillator.

The output pulses from the gate 152, which are indicative of the magnitude of the analog signal, are, for purposes of illustration, considered to be weigh pulses for use in a scale system. These weigh pulses are directed to a counter and indicator system 156 which is a modification of the counter and indicator system for weighing units sold under the trademark DIGITRUCK by the Fairbanks Weighing Systems Division of Colt Industries. The operation of the DIGITRUCK counter and indicator system for conventional weight indication purposes is described in U.S. Pat. No. 3,665,169, and for purposes of this application, the operation of the counter and indicator system 156 is described only to illustrate the novel round off and resolution control systems and the up-down counter assembly for the indicator which constitute a portion of the present invention.

Basically, the counter and indicator system 156 includes digital zero loop counters 158 which receive the weigh pulses originally passed by the gate 152 and zero counter memories 160 which register the outputs of the zero loop counters. Up-down counters 162 receive the value registered during a previous measuring cycle by the zero counter memories 160 and compare this value with a value registered in the up-down counters by the weigh pulses generated during a subsequent measurement cycle to provide either a sum or difference output. This sum or difference output is provided to memories 164 and from these memories to drivers 166 to drive indicators 168 in accordance with the output from memories.

A round off, resolution and tare control unit 170 controls the up-down counters 162 to provide a novel round off of counter indications, to control the resolution of an indication provided by the indicator system, and to provide a preset tare control for the counters. This tare control is accomplished in accordance with a tare indication set into the tare counters 172 in known manner by tare switches 173. This tare indication counted down until a zero condition of the tare counters is sensed by a gate 175, and during this count down, the round off, resolution and tare control unit 170 is presetting the tare into the up-down counters 162.

Figure 5:
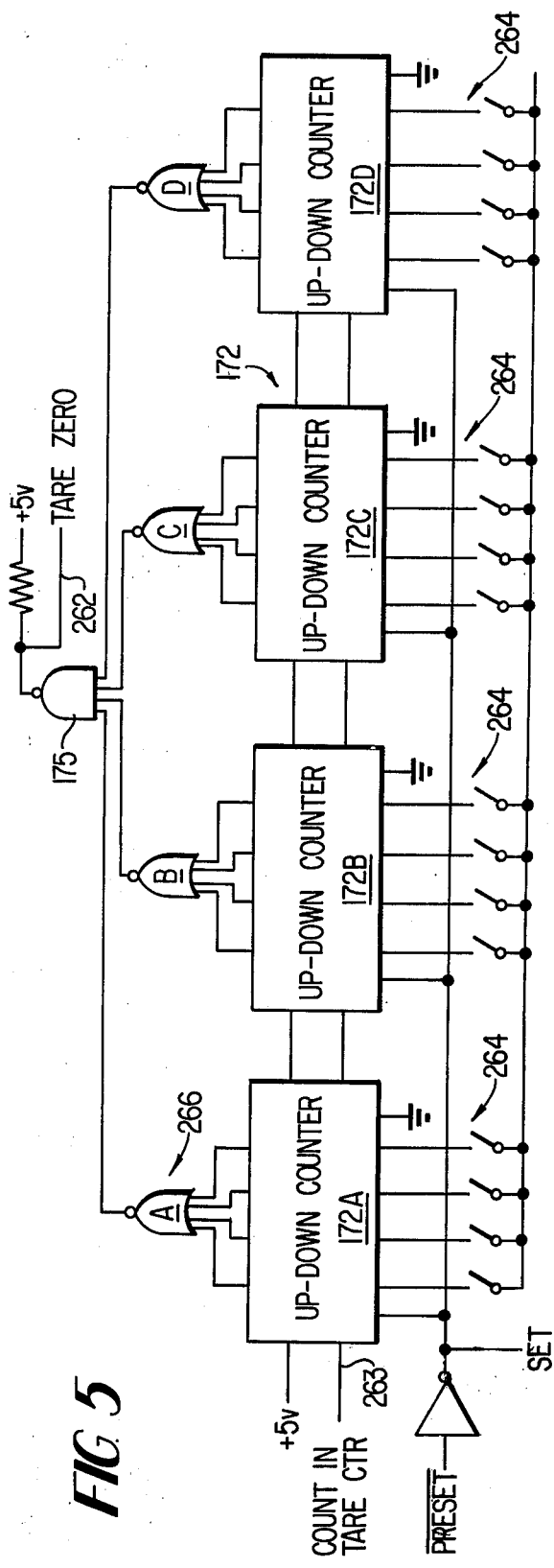
FIG. 5 is a block diagram of the tare counter unit of FIG. 2.
Figure 3B:
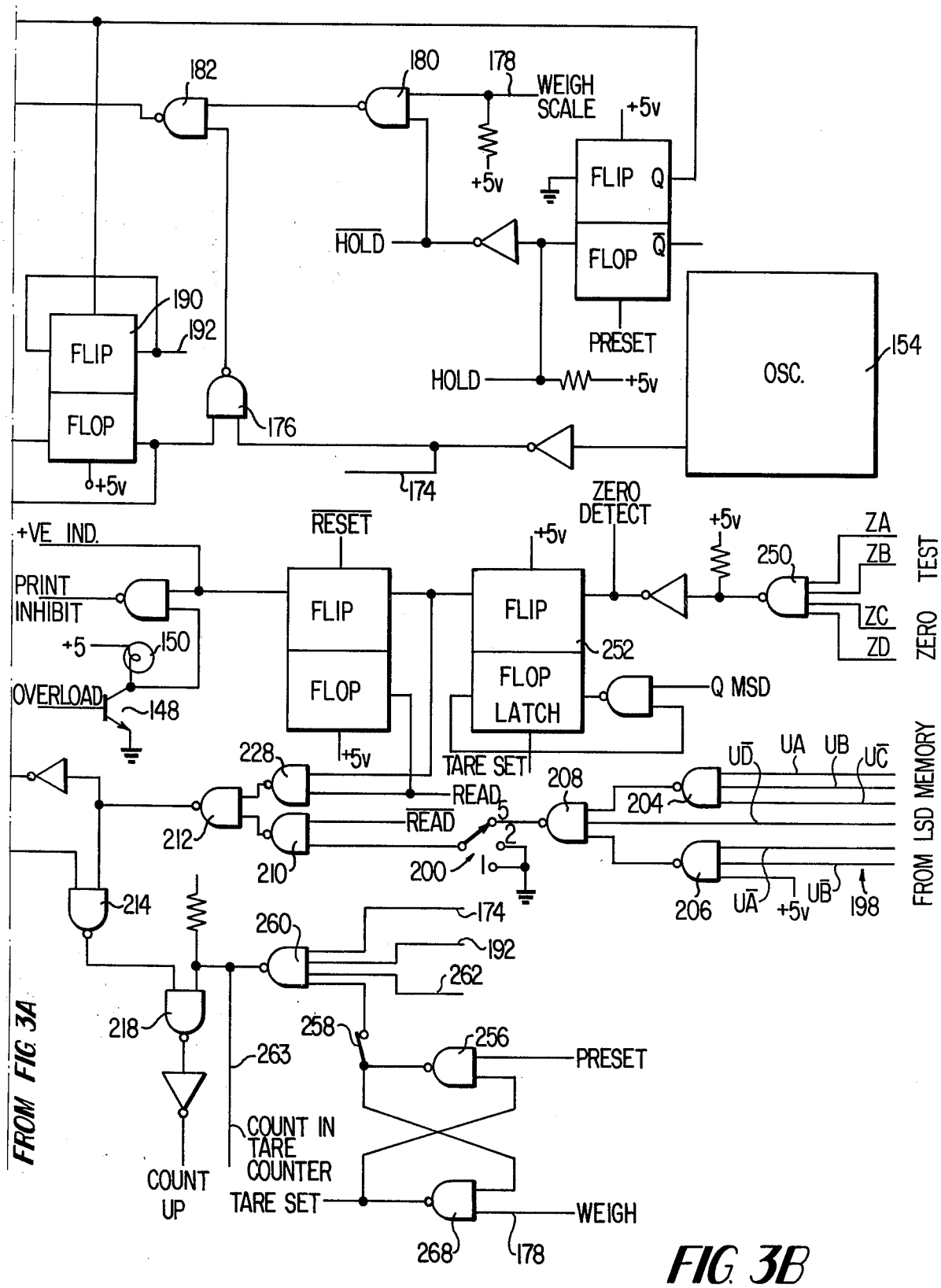
FIGS. 3 (A & B) is a circuit diagram of the round off, ranging and tare control unit of FIG. 2.

The complete operation of the round off, resolution and tare control unit 170 will best be understood by referring to FIGS. 3–5, and particularly to FIG. 3 which provides a detailed illustration of the unit. This round off, resolution and tare control unit receives pulses from the oscillator 154 which provides constant frequency output pulses at a relatively high frequency (for example 1MHz). These oscillator pulses are directed to an output 174 which provides pulses to other portions of the system to be described and also to one input of a gate 176.

Pulses from the control pulse source 92 (FIG. 1) are provided on a line 178 and by a gate 180 to cause a gate 182 to pass the oscillator pulses from the gate 176 to a counter sequencer 184. This counter sequencer controls the operation of the round off, resolution and tare control unit 170 and some of the operation of the counter and indicator unit 156 in accordance with pulses from the oscillator. For example, the counter sequencer registers a predetermined number of pulses for each measurement cycle initiated by the control pulse source and operates in response to various predetermined counts (i.e. 1–16) to provide system control. Thus, during an early count, a counter sequencer output causes a preset flip flop 186 to change state and provide a preset control pulse to various portions of the system designated "preset" on the drawings. Later, under the control of the counter sequencer, the preset flip flop is changed back to an original state to provide a non-preset control pulse to the system.

Similarly, the outputs from the counter sequencer cause a read flip flop 188 to change state and control the transfer of data stored in the zero counter memories 160 to the up-down counters 162 in the counter and indicator system 156. Similarly, the output from the read flip flop 188 coupled with the output from the counter sequencer 184 controls the read out from the memories 164 into the drivers 166 of the counter and indicator system.

When the counter sequencer 184 counts the last pulse in the normal measuring cycle, the output therefrom causes a flip flop 190 to change state and close the gate 176 to block pulses from the oscillator 172 so that the counter sequencer may be readied for a new measurement cycle. This change of state of the flip flop 190 at the last position of the counter sequencer causes the flip flop to provide a last count output on an output 192 and also causes the flip flop to reset for a new cycle. Additionally, the flip flop 190 provides signals to gates 194 and 196 which cause the preset flip flop 186 and the read flip flop 188 to change state.

The above description will provide a general concept of the manner in which the round off, resolution and tare control unit 170 sequences the counter and indicator unit 156, and this will provide a background for understanding the novel operation of the unit to accomplish a round off function, a resolution control and a tare control function. For understanding the round off function, references should be made to FIG. 3 in conjunction with FIG. 4 wherein the counter and indicator system 156 is illustrated in detail. It will be noted from FIG. 4 that the zero loop counters 158 are divided into decade sections and include a unit section 158A, a tens section 158B, a hundreds section 158C, and a thousands section 158D. This decade division occurs throughout the zero counter memories 160, the up-down counters 162, the memories 164, the drivers 166 and the indicators 168. It will be noted that the up-down counters 162 provide a binary coded decimal output in known manner to the memories 164 which in turn provide a binary coded decimal output to the drivers 166. For round off purposes, the binary decimal coded outputs from the units memory 164A are sensed and directed to the round off, ranging and tare control unit 170. These sensed outputs are indicated at 198 in FIG. 4, and it will be noted that certain of the outputs are provided to the round off, resolution and tare control unit 170 of FIG. 3.

Referring now to FIG. 3, the round off, resolution and tare control unit 170 is adapted to round off the indication provided by the units section 168A of the indicator 168 by ones, by twos, or by fives. When rounding by ones and twos is accomplished, the indication is rounded down, but when rounding by fives is accomplished, the indication is rounded either up or down to the nearest five number. The rounding to be achieved is determined by the setting of two switches 200 and 202 which are ganged together. These switches move between a one terminal, a two terminal, and a five terminal as indicated in FIG. 3, and the position of the switches controls which type of rounding occurs. The switch 200 passes a signal which determines whether the rounding will be up or down, and a logic "zero" signal across the switch 200 results in down rounding while a logic "one" signal results in up rounding. It will be noted that when rounding by ones or twos occurs, the rounding is always down as the switch will be connected to ground. When rounding by fives occurs, the number present at the outputs 198 of the memory 164A must be sensed at the input to gates 204, 206 and 208 to provide either a logic "one" or a logic "zero" output from the gate 208 across the switch 200. When the gates 204, 206 and 208 sense a binary coded decimal one, two, six or seven, it will be desirable to round down to zero for one and two indications and to five for six and seven indications and therefore the output of the gate 208 will be a logic "zero". When the gates 204, 206 and 208 sense a three or four or an eight or nine indication at the outputs 198 of the memory, it will be desirable to round up to five for the three or four indications and to round up to zero (ten) for the eight and nine indications. Therefore, the output of the gate 208 will be a logic "one". The logic output from the gate 208 is directed across the switch 200 and passed through gates 210 and 212 which have been previously activated by the read flip flop 188. A logic "one" signal passing through the gate 212 operates to activate a gate 214 while a logic "zero" signal from the gate 212 operates to activate a gate 216. The output of the gate 214 passes through a gate 218 to the count up terminal of the up-down counter 162A (FIG. 4) while the output of the gate 216 is connected to account down terminal of the up-down counter 162A.

In order to drive the up-down counter 162A for round off purposes, the outputs 198 are also connected to gates 220 and 222. The outputs of these gates are either a logic "one" or a logic "zero" which pass across the switch 202 to control the activation of gate 224. A logic "one" output activates the gate 224 so that the gate passes pulses from the line 174 and the oscillator 154, while a logic "zero" at the input to the gate causes the gate to block these pulses. When the switch 202 is on the "one" terminal, a logic "zero" causes the gate 222 to block pulses from the line 174, and no rounding occurs. However, if the switch 202 is on the "two" terminal and the outputs 198 do not carry an even binary coded decimal number, under conventional binary coded decimal code, the terminal UA will be at a logic "one". This enables the gate 224 to pass pulses which are directed through a gate 226 to the inputs to the gates 214 and 216. Sensing the round by two mode, a logic "zero" is directed to the gate 216 from the gate 212, the gate 214 is not activated while the gate 216 is activated to pass pulses to the count down terminal of the up-down counter 162A. This counter will count down until the next lower even number is sensed at the outputs 198 of the memory 164A and, in accordance with conventional binary codes, when this even number is reached, a logic "zero" will appear on the output line UA and will close the gate 224. Obviously, if an even number is initially present on the outputs 198, a logic "zero" will occur across the switch 202 and the gate 224 will remain closed. In this case, no rounding is necessary and no rounding will occur.

In the round by five mode of the switches 200 and 202, the gates 220 and 222 will sense when either a "zero" or a five "five" is present on the outputs 198. In either of these cases, a logic "zero" will occur across the switch 202 to block the gate 224, and no rounding will occur. If binary coded decimal numbers other than "zero" or "five" are sensed by the gates 220 and 222, the output directed across the switch 202 to the gate 224 will be a logic "one" and the gate 224 will be activated to pass pulses from the line 174. These pulses will again pass through the gate 226 and will be directed to the inputs to the gates 214 and 216. Depending upon the logic output of the gate 212, one of the gates 214 or 216 will be activated to pass the pulses to either the count up or the count down terminal of the up-down counter 162A. If a binary coded decimal one or two is present on the outputs 198 or if a binary coded decimal six or seven is present, the gate 216 will be activated until a zero or five indication respectively occurs on the outputs 198, at which time the gates 220 and 222 cause the gate 224 to block further pulses. Similarly, if a three or four, or six or seven, occurs on the outputs 198, the gate 218 passes pulses to the count up terminal of the up-down counter 162A until the outputs 198 register either a five or zero respectively, at which time the gate 224 is blocked and further pulses are terminated. In this manner, no rounding, rounding down to the nearest even number, or rounding up or down to the nearest five is accomplished.

When a read output from the read flip flop 188 occurs to pass the contents of the memory unit 164 to the drivers 166, the same read output is directed to a gate 228 to block the gate 212.

The output pulses from the oscillator 154 through the gate 152 are directed to a divider network 230 including a plurality of binary coded decimal counters. The divider network selectively divides the input pulses by a selected amount to provide a divided output on one output line in each of two groups of output lines 232 and 234. The output lines 232 operate to feed pulses through a gate 236 to the zero loop counters 158 while the output lines 234 provide pulses through a gate 235 for the up-down counters 162. The divider network may divide the pulses from the gate 152 to selectively provide outputs in one of four ranges, and thus a line in each of the groups 232 and 234 might constitute a 25K count output line, another output line may constitute a 50K output line, another output line may constitute a 100K count output line, and another output line may constitute a 125K count output line. The output signals from the divider network 230 are applied across a selected output line in the group 232 and the gate 236 to the input of the zero loop counters 158, while similarly, a corresponding output on a corresponding output line in the group 234 is applied through amplifiers 238 and a gate 240 to the gate 226. When the gate 226 is receiving no input (logic "zero") from the gate 224, pulses from the gate 240 are permitted to pass through the gate 226 to the inputs of the gates 216 and 214. Similarly, when no output from the gate 240 is present at the input of the gate 226, the gate 226 is permitted to pass pulses from the gate 224. Whether the up-down counters 162 count up or down in response to the output pulses from the divider network 230 is determined by the state of these up-down counters. Each output line betwen the up-down counters 162A, 162B, 162C, 162D and the associated memories 164A, 164B, 164C, and 164D is connected to a sensing gate 242 (A, B, C and D). These sensing gates constitute zero test gates which provide an output of a first logic state when a number is present in an associated up-down counter and an output of a second logic state when the associated up-down counter is zeroed. Thus, the gates 242 determine when the associated up-down counter is at zero. When a number is present in any of the up-down counters, the outputs of the zero test gates 242 to a gate 244 (FIG. 3) cause the gate to provide an output which presets a flip flop latch 246 to a "zero" or count down state. This causes a "zero" logic signal to pass through the gate 228 and the gate 212 to activate the gate 216, and thus the pulses from the divider network 230 are passed through the gate 216 to the count down input of the up-down counters 162. These counters are counted down until they zero, at which point the gates 242 all change state to cause the output from the gate 244 to change the state of the flip flop latch 246. The flip flop latch now changes to an up count state and provides a "one" logic signal through the gate 228 and the gate 212 to activate the gate 214. At this point, pulses from the divider 230 are passed through the gate 214 and the gate 218 to the up count input of the up-down counters 162, and these counters now begin to count up. In this manner, conventional to absolute value up-down counters used in indicator systems, the previous count placed in the up-down counters from the zero counter memories 160 may be subtracted from the new measurement count obtained during a subsequent measuring cycle. Obviously, with no count stored in the zero counter memories 160 at the beginning of a measuring cycle, no count would be present in the up-down counters 162, and the up-down counters would immediately count up to indicate the complete value of a new measurement input.

Many electronic digital measuring instruments having exceptional stability still incorporate an inherent error of rather substantial proportions. For example, consider a digital weighing instrument which is graduated in one pound increments. If the input from the load cell is equivalent to 200 pounds and the instrument is provided with a push button zero and is zeroed at this point, a subsequent weight of 0.999 pounds applied to the load cell would result in a reading of zero. This is due to the fact that the maximum resolution of the instrument is one pound and the instrument thus cannot read one pound unless the weight applied thereto is between one pound and 1.999 pounds. With no weight on the scale platform and the instrument drifting downward from the 200 pounds at which push button zeroing was accomplished to an equivalent input of 199.99 pounds, the display will now read one pound.

Obviously, if the resolution of the weighing instrument is increased, it would display changes more accurately. The round off, resolution and tare control unit 170 of FIG. 3 increases the resolution of measurement and provides rounding of the display to the nearest graduation without requiring the resolution of the display unit to be increased.

More specifically, if 16,000 pulses pass through the gate 152 into the divider network 230 during a zero cycle, with a divider ratio of 40, then the total number of counts entered in the zero loop counter 160 is 400. The net content of the divider network at the end of the cycle will be zero. If on a subsequent weigh cycle 15,999 pulses are entered, then the net content of the up-down counter 162 will be 399, resulting in a display of −1. A remainder of 39 will be left in the divider network or 39/40 of a graduation. It can also be shown that if 15,999 pulses are entered during a zero cycle, then the zero loop counter content will be 399, leaving a remainder of 39 in the divider network. If 16,000 pulses are now entered on a following weigh cycle, this will result in 400 being stored in the up-down counters, giving a display of +1, and leaving a remainder of zero in the divider.

Figure 7:
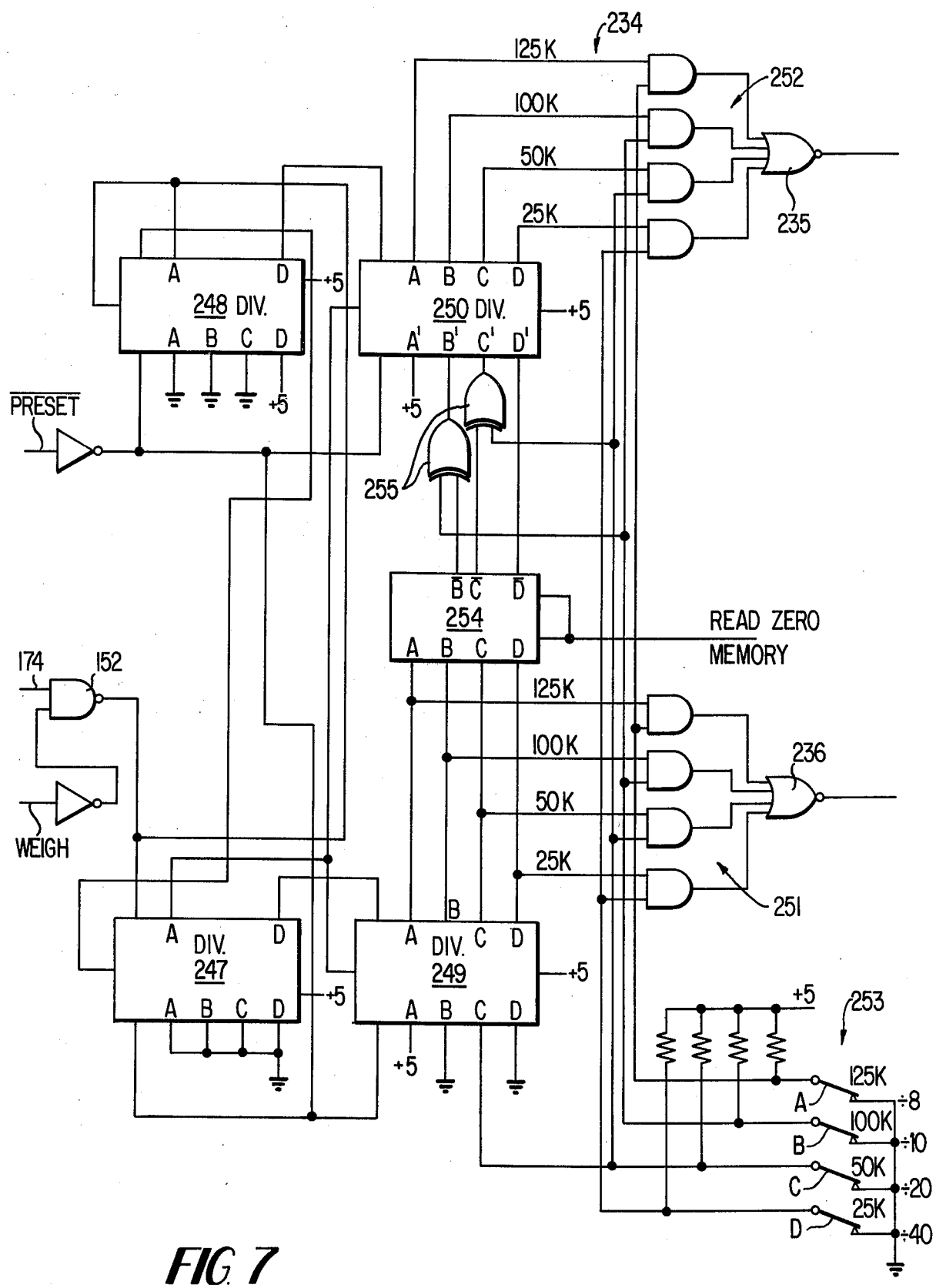
FIG. 7 is a circuit diagram of the divider network of FIG. 3.

The circuit of FIGS. 3 and 7 examines the remainder in the divider network 230 during the zero cycle and modifies the input count to overcome the digital instability. To develop this remainder, the pulses from the gate 152 are fed to first binary counter-divider stages 247 and 248 where they are divided by an equal amount and then directed to the inputs of binary counter divider stages 249 and 250 respectively. Binary counter-divider stage 249 forms a zero loop divider while binary counter-divider stage 250 forms a main divider. The zero loop divider and main divider are identical in structure and provide the output groups 232 and 234 of FIG. 3. Thus, with the 1MHz input to the gate 152, the outputs from the counter divider stages 249 and 250 constitute a divide by 40 output (25K), a divide by 20 output (50K), a divide by 10 output (100K) and a divide by 8 output (125K). The output lines from these counter divider stage outputs are controlled by switching gates 251 and 252 which are NOR gates operating in accordance with the following truth table:

| | |
|---|---|
| input | 0 1 0 1 |
| | 0 0 1 1 |
| output | 1 0 0 0 |

These gates 251 and 252 are selectively provided with inputs by switches 253 which are selected in accordance with the rounding to be accomplished under the control of switches 200 and 202 (FIG. 3). When rounding by ones is accomplished, the switch 253D is closed, for rounding by twos, the switch 253C is closed, and for rounding by fives, the switch 253B or the switch 253A is closed. These switches 253 control the ranging provided by the divider network 230.

The outputs from the zero loop divider 249 are not only connected to the gates 251 as shown in FIG. 7, but are also connected to provide inputs to a memory unit 254. This memory unit is the same as the units constituting the memories 164 and has outputs which feed the inputs of the main divider 250 to preset the main divider. Two outputs from the memory unit 254 are connected to EXCLUSIVE OR gates 255, one of which has a second input connected to the switch 253B and the remaining one having a second input connected to the switch 253C. The truth table for the EXCLUSIVE OR gates 255 is as follows:

| | |
|---|---|
| inputs | 0 1 0 1 |
| | 0 0 1 1 |
| outputs | 0 1 1 0 |

Also it will be noted that one output from the memory unit 254 is connected directly to an input of the main divider 250.

The memory 254 stores the residual from the zero loop divider 249 and provides a preset to the main divider 250 when the zero memories 164 are read. When the switches 253 are set for the rounding by one or the rounding by fives mode, the logic provided by the gates 251 and 236 causes 0.5 graduations to be added to the zero loop counters 160. This can be accomplished by selectively inverting the input count to the zero loop counters so that the zero loop counters count the leading edge of the weight pulses while the up-down counters count the trailing edge.

By examining the remainder left in the divider network after the zero cycle, an algorithm for modifying the input count during a weigh cycle can be developed.

Any count from 15980 to 16019 when entered into the divider network during a weigh cycle will cause 400 to be stored in the zero loop counters, and if this count, at any point, was to vary by −19 to +20, then the content of the up-down counters would always be 400 giving a display output of zero.

| Counts In | Zero Loop Content Counter | Zero Loop Divider Remainder | Modified Preset | Modified Input Count | Main Counter Content |
|---|---|---|---|---|---|
| 15980 | 400 | 20 | 39 | 16019 | 400 |
| 15981 | ↑ | 21 | 38 | ↑ | ↑ |
| 15982 | ↑ | 22 | 37 | ↑ | ↑ |
| 15983 | ↑ | 23 | 36 | ↑ | ↑ |
| 15984 | ↑ | 24 | 35 | ↑ | ↑ |
| 15985 | ↑ | 25 | 34 | ↑ | ↑ |
| 15986 | ↑ | 26 | 33 | ↑ | ↑ |
| 15987 | ↑ | 27 | 32 | ↑ | ↑ |
| 15988 | ↑ | 28 | 31 | ↑ | ↑ |
| 15989 | ↑ | 29 | 30 | ↑ | ↑ |
| 15990 | ↑ | 30 | 29 | ↑ | ↑ |
| 15991 | ↑ | 31 | 28 | ↑ | ↑ |
| 15992 | ↑ | 32 | 27 | ↑ | ↑ |
| 15993 | ↑ | 33 | 26 | ↑ | ↑ |
| 15994 | ↑ | 34 | 25 | ↑ | ↑ |
| 15995 | ↑ | 35 | 24 | ↑ | ↑ |
| 15996 | ↑ | 36 | 23 | ↑ | ↑ |
| 15997 | ↑ | 37 | 22 | ↑ | ↑ |
| 15998 | ↑ | 38 | 21 | ↑ | ↑ |
| 15999 | ↑ | 39 | 20 | ↑ | ↑ |
| 16000 | ↑ | 0 | 19 | ↑ | ↑ |
| 16001 | ↑ | 1 | 18 | ↑ | ↑ |
| 16002 | ↑ | 2 | 17 | ↑ | ↑ |
| 16003 | ↑ | 3 | 16 | ↑ | ↑ |
| 16004 | ↑ | 4 | 15 | ↑ | ↑ |
| 16005 | ↑ | 5 | 14 | ↑ | ↑ |
| 16006 | ↑ | 6 | 13 | ↑ | ↑ |
| 16007 | ↑ | 7 | 12 | ↑ | ↑ |
| 16008 | ↑ | 8 | 11 | ↑ | ↑ |
| 16009 | ↑ | 9 | 10 | ↑ | ↑ |
| 16010 | ↑ | 10 | 9 | ↑ | ↑ |
| 16011 | ↑ | 11 | 8 | 75 | ↑ |
| 16012 | ↑ | 12 | 7 | ↑ | ↑ |
| 16013 | ↑ | 13 | 6 | ↑ | ↑ |
| 16014 | ↑ | 14 | 5 | ↑ | ↑ |
| 16015 | ↑ | 15 | 4 | ↑ | ↑ |
| 16016 | ↑ | 16 | 3 | ↑ | ↑ |
| 16017 | ↑ | 17 | 2 | ↑ | ↑ |
| 16018 | ↑ | 18 | 1 | ↑ | ↑ |
| 16019 | 400 | 19 | 0 | 16019 | 400 |
| 16020 | 401 | 20 | 39 | 16059 | 401 |

If any other series of input counts were chosen, then a similar improvement in digital stability can be demonstrated. If the most significant bits of the divider network were chosen to be binary, then the following state diagram can be developed for examining the remainder of the zero loop divider after a zero cycle and modifying it to preset the main divider to achieve ± ¼ graduation stability. It can be shown that as the number of bits are increased then a greater resolution in the stability will be made.

The following table illustrates the operation of the circuit of FIG. 7.

| | | 0 1 2 3 | 4 5 6 7 | 8 | 9 | 10 | 11 | 12 | 13 | 14 | 15 | |
|---|---|---|---|---|---|---|---|---|---|---|---|---|
| Outputs of 249 | A | 0 1 0 1 | 0 1 0 1 | 0 | 1 | 0 | 1 | 0 | 1 | 0 | 1 | Remainder after zero cycle Least significant bit of remainder |
| | B | 0 0 1 1 | 0 0 1 1 | 0 | 0 | 1 | 1 | 0 | 0 | 1 | 1 | |
| | C | 0 0 0 0 | 1 1 1 1 | 0 | 0 | 0 | 0 | 1 | 1 | 1 | 1 | |
| | D | 0 0 0 0 | 0 0 0 0 | 1 | 1 | 1 | 1 | 1 | 1 | 1 | 1 | Most significant bit of remainder |
| | | 7 6 5 4 | 3 2 1 0 | 15 | 14 | 13 | 12 | 11 | 10 | 9 | 8 | Modified Preset |
| Inputs of | A′ | 1 0 1 0 | 1 0 1 0 | 1 | 0 | 1 | 0 | 0 | 0 | 1 | 0 | Least significant bit |

-continued

```
250
    B'  1100 1100  1  1  0  0  1  1  0  0    of preset
    C'  1111 0000  1  1  1  1  0  0  0  0
    D'  0000 0000  1  1  1  1  1  1  1  1    Most signi-
                                              ficant bit
                                              preset
```

A, B, C & D are the divider output of the zero loop divider 249 after the zero cycle.
  D will have a binary weight of one-half grad.
  C will have a binary weight of one-fourth grad.
  B will have a binary weight of one-eighth grad.
  A will have a binary weight of one-sixteenth grad.
  A', B', C' and D' are the modified output of the main divider to be preset after examination of the remainder.
  D' — will have a binary weight of one-half graduation.
  C' — will have a binary weight of one-fourth graduation.
  B' — will have a binary weight of one-eighth graduation.
  A' — will have a binary weight of one-sixteenth graduation.

This circuit will work as described above when the graduation is in units of 1 or 5.

When rounding by five units, it will be recalled that if the counter content is 1 or 2, then the number will be rounded down to zero and a number of 3 or 4 will be increased to 5. A number of 6 or 7 rounded down to 5 and 8 and 9 rounded up to 10.

Thus, if the count were to vary by a value smaller than ± 2½ graduations after a zero cycle, then the display will always read zero.

When an instrument is dedicated to read by increments of 2 weight units and is zeroed by twos, then a further modification of the remainder is required. After a zero cycle, it should be possible to vary the input count by an amount equivalent to ± 1 count or ± ½ graduation and still have the display read zero. The previous solution for increments of one or five units would allow for a variation of ± ½ count which was ± ¼ graduation for a one increment system and ± 1/10 graduation for a 5 increment system.

A similar analysis as made for the one and five increment systems may be made when rounding is by twos. Now however, the pulse input to the zero counter must be the same as that for the main counter (in phase and not inverted), and a number should be added to the remainder of the zero loop counter so that the net result equals approximately 1 count of the main counter.

| Counts In | Zero Counter Content | Zero Divider Remainder | Modified Preset | Modified Input Count | Main Counter Content |
|---|---|---|---|---|---|
| 15980 | 799 | 0  | 19 | 15999 | 799 |
| 15981 |     | 1  | 18 |       |     |
| 15982 |     | 2  | 17 |       |     |
| 15983 |     | 3  | 16 |       |     |
| 15984 |     | 4  | 15 |       |     |
| 15985 |     | 5  | 14 |       |     |
| 15986 |     | 6  | 13 |       |     |
| 15987 |     | 7  | 12 |       |     |
| 15988 |     | 8  | 11 |       |     |
| 15989 |     | 9  | 10 |       |     |
| 15990 |     | 10 | 9  |       |     |
| 15991 |     | 11 | 8  |       |     |
| 15992 |     | 12 | 7  |       |     |
| 15993 |     | 13 | 6  |       |     |
| 15994 |     | 14 | 5  |       |     |
| 15995 |     | 15 | 4  |       |     |
| 15996 |     | 16 | 3  |       |     |
| 15997 |     | 17 | 2  |       |     |
| 15998 |     | 18 | 1  |       |     |
| 15999 | 799 | 19 | 0  | 15999 | 799 |
| 16000 | 800 | 0  | 19 | 16019 | 800 |
| 16001 |     | 1  | 18 |       |     |
| 16002 |     | 2  | 17 |       |     |
| 16003 |     | 3  | 16 |       |     |
| 16004 |     | 4  | 15 |       |     |
| 16005 |     | 5  | 14 |       |     |
| 16006 |     | 6  | 13 |       |     |
| 16007 |     | 7  | 12 |       |     |
| 16008 |     | 8  | 11 |       |     |
| 16009 |     | 9  | 10 |       |     |
| 16010 |     | 10 | 9  |       |     |
| 16011 |     | 11 | 8  |       |     |
| 16012 |     | 12 | 7  |       |     |
| 16013 |     | 13 | 6  |       |     |
| 16014 |     | 14 | 5  |       |     |
| 16015 |     | 15 | 4  |       |     |
| 16016 |     | 16 | 3  |       |     |
| 16017 |     | 17 | 2  |       |     |
| 16018 |     | 18 | 1  |       |     |
| 16019 | 800 | 19 | 0  | 16019 | 800 |
| 16020 | 801 | 0  | 19 | 16039 | 801 |

With the same binary divider 249 but with the tap one decade back from the most significant place, so that twice the number of counts enter the counters, the following state diagram can be constructed.

|       | 0  | 1  | 2  | 3  | 4  | 5  | 6  | 7  | 8  | 9  | 10 | 11 | 12 | 13 | 14 | 15 |                              |
|-------|----|----|----|----|----|----|----|----|----|----|----|----|----|----|----|----|------------------------------|
|       |    |    |    |    |    |    |    |    |    |    |    |    |    |    |    |    | Remainder after zero cycle   |
| V     | 0  | 1  | 0  | 1  | 0  | 1  | 0  | 1  | 0  | 1  | 0  | 1  | 0  | 1  | 0  | 1  | Least significant bit of remainder |
| W     | 0  | 0  | 1  | 1  | 0  | 0  | 1  | 1  | 0  | 0  | 1  | 1  | 0  | 0  | 1  | 1  |                              |
| X     | 0  | 0  | 0  | 0  | 1  | 1  | 1  | 1  | 0  | 0  | 0  | 0  | 1  | 1  | 1  | 1  |                              |
| Y     | 0  | 0  | 0  | 0  | 0  | 0  | 0  | 0  | 1  | 1  | 1  | 1  | 1  | 1  | 1  | 1  | Most significant bit of remainder |
|       | 15 | 14 | 13 | 12 | 11 | 10 | 9  | 8  | 7  | 6  | 5  | 4  | 3  | 2  | 1  | 0  | Modified Preset              |
| V¹    | 1  | 0  | 1  | 0  | 1  | 0  | 1  | 0  | 1  | 0  | 1  | 0  | 1  | 0  | 1  | 0  | Least significant bit of remainder |
| W¹    | 1  | 1  | 0  | 0  | 1  | 1  | 0  | 0  | 1  | 1  | 0  | 0  | 1  | 1  | 0  | 0  |                              |
| X¹    | 1  | 1  | 1  | 1  | 0  | 0  | 0  | 0  | 1  | 1  | 1  | 1  | 0  | 0  | 0  | 0  |                              |
| Y¹    | 1  | 1  | 1  | 1  | 1  | 1  | 1  | 1  | 0  | 0  | 0  | 0  | 0  | 0  | 0  | 0  | Most significant bit of remainder |

By examination $V = V^1$, $W = W^1$, $X = X^1$, $Y = Y^1$

V, W, X and Y are the divider output after a zero cycle.
  Y will have a binary weight of one-fourth graduation.
  X will have a binary weight of one-eighth graduation.
  W will have a binary weight of one-sixteenth graduation.

V will have a binary weight of one-thirtysecond graduation.

$V^1$, $W^1$, $X^1$ and $Y^1$ are the modified output of the divider to be preset after examination of the remainder.

$Y^1$ will have a binary weight of one-fourth graduation.

$X^1$ will have a binary weight of one-eighth graduation.

$W^1$ will have a binary weight of one-sixteenth graduation.

$V^1$ will have a binary weight of one-thirtysecond graduation.

Again, as in the description for the divider network set for rounding by ones and by fives, the four most significant decades have been shown, the more places the better the resolution of the correction factor.

After a zero cycle, it can be seen that if the input is varied by an amount equivalent to ± ½ graduation then the display will read zero.

The round off, resolution and tare control unit 170 operates to set a preset tare count into the counter and indicator unit 156 prior to each measuring cycle. To accomplish this, the preset pulse from the preset flip flop 186 is provided to the input of a gate 256 and causes an output which passes through a switch 258 to the input of a gate 260. The gate 260 operates to pass pulses from the line 174 and the oscillator 154 when the preset signal through the gate 256 is present at the input thereto, there is an input on a line 262 to indicate the tare counters to be subsequently described are preset and are not at zero, and an input on a line 192 indicates that the flip flop 190 has been reset by the last count (i.e., sixteenth count) of the counter sequencer 184. When the gate 260 is activated, the pulses on the line 174 pass through the gate and then simultaneously pass to a tare counter line 262 and through the gate 218 to the count up terminal of the up-down counters 162.

Referring now to FIG. 5, the tare counters 172 include an up-down counter for each decade of the counter and indicator system 156. Thus, there is a units tare counter 172A, a tens tare counter 172B, a hundreds tare counter 172C, and a thousands tare counter 172D. The tare counters are preset to a predetermined tare by the tare switches 173 which count the tare into the counters by means of input lines 264. Once the tare is stored in the tare counters, a plurality of gates 266 A-D respectively connected to the outputs of each tare counter decade sense the count which is stored in the counter decade and provide an input to the gate 175 indicating that the counters are not zeroed. The output from the gate 175 assumes a "not zero" logic level and is provided on the line 262 to the input of the gate 260. As the gate 260 passes pulses over the line 263 to the down count input of the tare counters 172, the counters count down until all counters are zeroed. At the point where the counters zero, the number of counts provided into the counters is equal to the tare count preset into the counters. This same count has been provided through the gate 218 to the count-up terminals of the up-down counters 162 of the counter and indicator system 156, so that the tare count is stored in the up-down counters. When the tare count is zero, the gates 266 provide inputs to the gate 175 to indicate the zero condition, and the output from the gate 175 changes to a zero logic state. This output on the line 262 closes the gate 260 and no additional tare pulses are fed along the line 263 or through the gate 218.

To insure that the gate 260 is closed during a measuring operation, the control pulse along the line 178 is fed through a gate 268 to change the logic state of the output of the gate 256 provided to the input of the gate 260. Thus, should the tare counters malfunction and no tare zero input be provided on the line 262, the gate 260 will still be closed by the control pulse through the gate 268.

The switch 258 may be positioned to determine whether a gross weight or a net weight indication will be provided by the system for weighing applications. When the switch 258 is opened, no tare count can be provided through the gate 260, and therefore no tare will be preset into the up-down counters 162 of the counter and indicator system 156. Conversely, with the switch 258 in the closed position, tare will be preset into the up-down counters 162 and a net weight indication will be provided.

As previously described, once the tare is preset into the up-down counters 162, the zero test gates 248A-D thereof will sense that a count is present in the counters so that initial pulses fed into the counters will be provided to the count down terminal thereof until the tare is counted out. At this point, the count will be provided to the count up terminals to obtain a net count indication.

The novel pulsed transducer power supply system incorporated in the electronic measuring unit 10 of FIG. 1 is readily adaptable to electronic measuring units which do not employ a ramp generator and the ramp conversion mode of operation used by the circuit of FIG. 1. For example, the pulsed power supply is readily adaptable to many battery powered measuring systems, such as a load cell system for vehicular portable grain mixers and mills. These battery powered portable weighing systems are generally powered from a vehicle battery and require an excessive warm-up time before the system can be operated. Additionally, these direct battery powered weighing systems constitute a drain on the vehicle battery, and thus the system must be turned off during temporary periods of non use and then turned on and warmed up again before use. The pulsed transducer power supply of the present invention eliminates the warm up time previously required by battery powered vehicular weighing systems and also a system employing this type of supply need not be turned off as it minimizes drain on the battery during periods of non use.

Figure 6A:
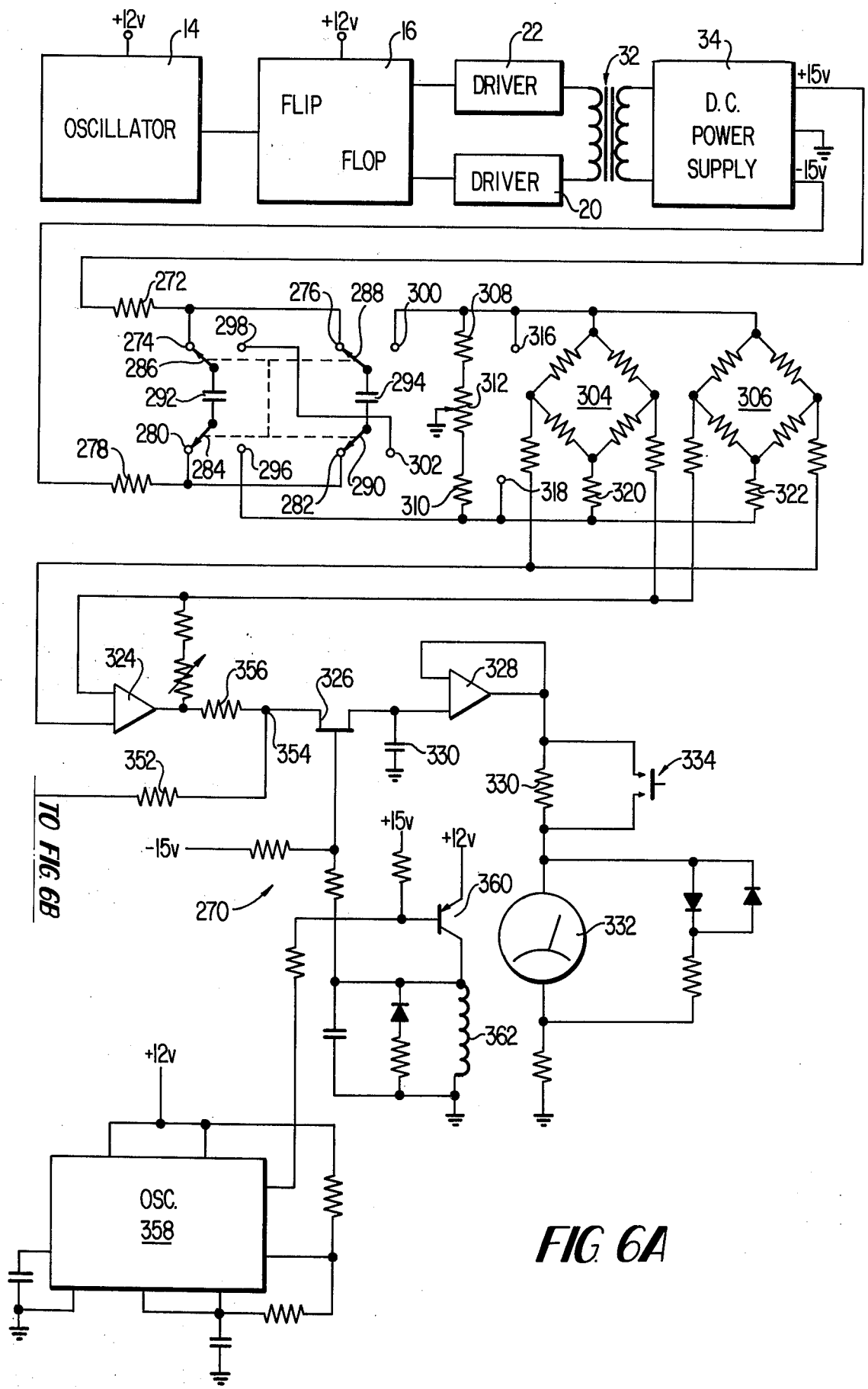
FIGS. 6 (A & B) is a circuit diagram of a second embodiment of the electronic measuring unit of the present invention.

Referring now to FIG. 6, there is disclosed an electronic measuring system which, for purposes of illustration, will be desribed as a weighing system having load cell transducers for providing an analog output signal indicative of weight applied thereto. This system, which is particularly adaptable for use as a battery powered vehicular weighing system, includes the power supply of FIG. 1 with the oscillator 14, the flip flop 16, the drivers 20 and 22, and the transformer 32 to the D.C. power supply 34. This system does not employ the full wave doubler and rectifier of FIG. 1.

The output from the D.C. power supply 34 is a +15 volt and −15 volt D.C. output symmetrical about ground. The positive terminal of the power supply is connected across a resistor 272 to switch terminals 274 and 276 while the negative output of the D.C. power supply is connected across a resistor 278 to switch terminals 280 and 282. Ganged relay switch arms 284, 286, 288 and 290, which are operated by a common relay coil, are illustrated in their normal position with the coil deenergized. In this position, switches 284 and 286 are in electrical contact with terminals 280 and 274 respectively while switches 288 and 290 are in electrical contact with terminals 276 and 282 respectively. A capacitor 292 is electrically connected between the switch arms 284 and 286 while a capacitor 294 is electrically connected between the switch arms 288 and 290. When the operating coil for the switch arms 284, 286, 288, 290 is energized, the switch arm 284 moves into contact with a terminal 296, the switch arm 286 moves into contact with a terminal 298, the switch arm 288 moves into contact with a terminal 300, and the switch arm 290 moves into contact with a terminal 302. The terminals 296 and 300 are connected to supply power to load cell bridges 304 and 306. Connected across the power inputs to the load cell bridges are resistors 308 and 310 which are connected in series with a potentiometer 312. The slider 314 of the potentiometer 312 is grounded, and this potentiometer constitutes a zero balance control for the load cell bridges. Also, terminal 300 is connected to a terminal 316 while terminal 296 is connected to a terminal 318.

For temperature compensation, each of the load cell bridges 304 and 306 is connected to the power supply from the terminal 296 by temperature compensating resistors 320 and 322 respectively.

The outputs from the load cell bridges 304 and 306 are connected to an amplifier 324 which provides an amplified load cell signal across a field effect transistor 326 to an operational follower amplifier 328. A capacitor 330 connected between the input to the operational follower and ground operates with the field effect transistor 326 as a sample and hold circuit.

The output from the operational amplifier follower 328 is provided across a resistor 330 to a meter indicator 332. A switch 334 shunts the resistor 330, and when manually operated, increases the sensitivity of the meter 332.

For vehicle weighing applications, it is often desirable to zero the meter 332 with the potentiometer 312 before weight is applied to the load cell system and then to program a desired weight into the system so that when the meter rezeros, the desired weight will be present. To accomplish this, a weight programming unit 334 is connected to the load cell power supply terminals 316 and 318. This weight programming unit includes a plurality of manually operated switches 336, 338 and 340 which may be selectively activated to connect selected resistors in resistor networks 342, 344 and 346 between input terminals 316 and the input to an amplifier 348. The output from the amplifier 348 is amplified in an amplifier 350 and passed across a resistor 352 to a summing point 354. The signal from the load cells at the output of the amplifier 324 is also passed across a resistor 356 to the summing point 354. The resistors 352 and 356 are of equal value and form a resistive divider on either side of the summing point, and the amplifiers 324 and 350 are balanced to balance out drift which might occur. Also, the outputs of these two amplifiers oppose each other, so that when the output from the load cells equal the output from the amplifier 350, a null occurs at the summing point 354.

An oscillator 358 is connected to the base of a transistor amplifier 360 and the output from the transistor amplifier operates to drive a relay coil 362 which operates the relay switches 284, 286, 288 and 290. Thus the pulse output from the oscillator 358 determines the frequency at which the relay switches will move between the terminals therefor. Also, the output from the transistor amplifier 360 is connected to the base of the field effect transistor 326 and operates to trigger the transistor into conduction when power is provided to the load cell circuit.

In the operation of the electronic measuring unit 270, pulses of power from the D.C. power supply 34 will be provided to the load cell circuit at a frequency determined by the oscillator 358. With the relay switches 284, 286, 288, and 290 in the position shown in FIG. 6, the capacitors 292 and 294 are connected across the output from the D.C. power supply, and each capacitor charges to a 30 volt charge. When the relay coil 362 is energized, the capacitors are connected to the power input for the load cell bridges 304 and 306 and therefore apply a 60 volt pulse to the load cell bridges. Load cell bridge 304 is an actual load cell bridge where, for some applications, the load cell bridge 306 will constitute a dummy balancing bridge.

The output pulse from the load cell bridges will be amplified in the amplifier 324 and compared at the summing point 354 with the opposing pulse from the weight programming unit 334. The difference will then be passed across the field effect transistor 326 which is also now energized and stored in the capacitor 330. The voltage from capacitor 330 is passed through the operational follower 328 to provide a reading on the meter 332, and the operation of the field effect transistor 326 and the capacitor 330 as a sample in hold circuit results in a meter reading in spite of the pulsing of the load cell unit.

Since the electronic measuring unit 270 is a pulsed unit and does not constantly draw power from the battery supply, the unit may be left on without considerable drain on the battery supply. Also, the operation of the circuit to apply relatively high voltage pulses to the load cell enables the unit to operate immediately without requiring the warm-up time normally required with non-pulsed load cell supplies.

We claim:

1. An electronic measuring system comprising measuring transducer means operative when electrically powered to provide an electrical measurement signal indicative of the magnitude of an entity being measured thereby, power means operative to power said transducer means, and stability sensing means connected to receive said electrical measurement signal and operating in response to an unstable electrical measurement signal to terminate the provision of power to said transducer means by said power means, said stability sensing means being responsive to the rate of change of said electrical measurement signal and operating when said electrical measurement signal changes in excess of a predetermined rate to prevent power from passing to said tranducer means from said power means.

2. The electronic measuring system of claim 1 wherein said power means includes electrical switching means connected to control the energization of said transducer means, said electrical switching means being operated by said stability sensing means to prevent power from reaching said transducer means in response to changes in an unstable electrical measurement signal in excess of said predetermined rate, said stability sensing means operating upon the subsequent stabilization of said electrical measurement signal from an unstable condition to cause said switching means to energize said transducer means.

3. An electronic measuring system comprising measuring transducer means operative when electrically energized to provide an electrical measurement signal indicative of the magnitude of an entity being measured thereby, power means operative to energize said transducer means, stability sensing means connected to receive said electrical measurement signal, said stability sensing means operating in response to an unstable measurement signal to prevent energization of said transducer means by said power means, measuring circuit means connected to receive said electrical measurement signal and control means operative to provide activating pulses to initiate the operation of said measuring circuit means, said control means operating in a first state to provide activating pulses of a first frequency and in a second state to provide activating pulses of a second frequency higher than said first frequency, said stability sensing means operating upon stabilization of a previously unstable electrical measurement signal to place said control means in said second state.

4. The electronic measuring system of claim 3 wherein said control means is normally operable in said first state, said stability sensing means operating upon stabilization of said electrical measurement signal from an unstable condition to place said control means in said second state for a delay period and to subsequently return said control means to said first state.

5. An electronic measuring system comprising measuring transducer means operative when electrically energized to provide an electrical measurement signal indicative of the magnitude of an entity being measured thereby, power means operative to energize said transducer means, said power means including electrical switching means connected to control the energization of said transducer means, and stability sensing means connected to receive said electrical measurement signal and operative in response to an unstable electrical measurement signal to prevent energization of said transducer means by said power means, said stability sensing means including a control signal generating means responsive to the rate of change of said electrical measurement signal, said control signal generating means operating when said electrical measurement signal increases in excess of a predetermined rate to provide a control signal to said electrical switching means to prevent power from passing to said transducer means from said power means to de-energize said transducer means in response to the unstable electrical measurement signal.

6. An electronic measuring system comprising electrically powered measuring transducer means operative when electrically powered to provide an electrical measurement signal indicative of the magnitude of an entity being measured thereby, power means operating to provide spaced sequential power pulses to power said measuring transducer means during the receipt thereby of a power pulse, said measuring transducer means being inoperative between power pulses, and measuring circuit means connected to receive said electrical measurement signal, said measuring circuit means including automatic drift correction means operative automatically between each of said power pulses to store error signals present in said measuring circuit means with said transducer means inoperative, said drift correction means operating during operation of said transducer means to correct the electrical measurement signal to compensate for said error signals.

7. The electronic measuring system of claim 6 wherein said measuring circuit means includes stability sensing means connected to sense said electrical measurement signal and operative to terminate the power pulse to said transducer means by said power means in response to an unstable electrical measurement signal.

8. The electronic measuring system of claim 7 wherein said power means is operative in first state to provide power pulses of a first frequency and in a second state to provide power pulses of a second frequency higher than said first frequency, said stability sensing means operating upon stabilization of a previously unstable electrical measurement signal to place said power means in said second state.

9. The electronic measuring system of claim 8 wherein said power means is normally operable in said first state, said stability sensing means operating upon stabilization of said electrical measurement signal from an unstable condition to place said power means in said second state for a delay period and to subsequently return said power means to said first state.

10. The electronic measuring system of claim 6 wherein said measuring circuit means includes a ramp generator for generating a linearly increasing ramp signal and zeroing means operable between said power pulses to zero said ramp generator.

11. The electronic measuring system of claim 6 wherein said measuring circuit means includes amplifier means connected to receive and amplify the electrical output signal from said transducer means, capacitive coupling means having an input side connected to the output of said amplifier means and an output side, said semiconductor switch means operative to connect the output side of said capacitive coupling means to an electrical ground between said power pulses and to disconnect the output side of said capacitive coupling means from the electrical ground during the operation of said transducer means.

12. The electronic measuring system of claim 11 wherein said measuring circuit means includes filter amplifier means connected to the output side of said capacitive coupling means.

13. The electronic measuring system of claim 6 wherein said measuring circuit means includes an integrator ramp generator means for generating linearly increasing ramp signals, said ramp generator means including a feedback capacitor connected between the input and output thereof and semiconductor switching means connected to selectively complete or block an electrical circuit around said feedback capacitor means, said semiconductor switching means operating to complete said electrical circuit to zero said ramp generator means between said power pulses and to block said electrical circuit when said transducer means is operative.

14. The electronic measuring system of claim 13 wherein said measuring circuit means includes a single comparator means having a first input connected to receive the ramp signal from said ramp generator means and a second input connected to receive said electrical measurement signal, said comparator means operating to provide an output signal indicative of when the magnitude of said ramp signal reaches a coincidence point with said electrical measurement signal.

15. An electronic measuring system comprising electrically powered measuring transducer means for providing an electrical measurement signal indicative of the magnitude of a function to be measured thereby, said measuring transducer means operating only when receiving power to provide said electrical measurement signal in response to a function to be measured, electrical mesuring circuit means connected to receive said electrical measurement signal, said electrical measuring circuit means including reference generating means for generating a substantially linearly increasing reference signal for comparison with said electrical measurement signal and comparison means connected to receive said reference and measurement signals, said comparison means operating to provide an indication when said reference signal reaches a coincidence point with said measurement signal, and a single electrical power supply means operative to supply electrical power for both said measuring transducer means and said measuring circuit means, said single power supply means operating to supply sequential, spaced power pulses to said transducer means and a substantially steady state direct current to power to said measuring circuit means.

16. The electronic measuring system of claim 15 wherein said single power supply means includes a single direct current source, first circuit means connected to said single source of direct current to provide direct current to power said measuring circuit means, and power control means connected to said single source of direct current to receive and convert direct current power received from said single source of direct current into sequential, spaced power pulses for said transducer means.

17. The electronic measuring system of claim 16 wherein said power control means includes control pulse producing means for producing sequential control pulses, switch means connected to receive said control pulses, said switch means being operative in response to a control pulse to provide direct current power from said single source of direct current to sais transducer means.

18. The electronic measuring system of claim 17 wherein said comparison means operates to cause said switch means to terminate the flow of direct current power from said single source of direct current to said transducer means when the reference signal reaches a coincidence point with said measurement signal.

19. The electronic measuring system of claim 17 wherein said switch means includes a light source which is illuminated in response to a control pulse, a solid state switching means connected to control the flow of direct current power from said single source of direct current to said transducer means, and light sensing means operative in response to the illumination of said light source to cause said solid state switching means to permit direct current power to flow to said transducer means, said light sensing means operating when said light source is not illuminated to cause said solid state switching means to block the flow of direct current power from said single source of direct current to said transducer means.

20. The electronic measuring system of claim 17 wherein said control pulse producing means is operative in a first state to provide control pulses of a first frequency and in a second state to provide control pulses of a second frequency higher than said first frequency.

21. The electronic measuring system of claim 20 wherein said measuring circuit means includes stability sensing means connected to sense said electrical measurement signal and operative to cause said switch means to terminate the flow of direct current power from said single source of direct current to said transducer means in response to an unstable electrical measurement signal.

22. The electronic measuring system of claim 21 wherein said control pulse producing means is normally operable in said first state, said stability sensing means operating upon the stabilization of said electrical measurement signal from an unstable condition to cause said control pulse producing means to operate in said second state for a delay period and at the termination of such delay period to return said control pulse producing means to the first state.

23. An electronic measuring system comprising electrically powered measuring transducer means for providing an electrical measurement signal indicative of the magnitude of a function to be measured thereby, said measuring transducer means operating only when receiving power to provide said electrical measurement signal in response to a function to be measured, electrical measuring circuit means connected to receive said electrical measurement signal, said electrical measuring circuit means including reference generating means for generating a reference signal for comparison with said electrical measurement signal and comparison means connected to receive said reference and measurement signals, said comparison means operating to provide an indication when said reference signal reaches a coincidence point with said measurement signal, and power supply control means operative to supply electrical power pulses to said transducer means and to control the operation of said transducer means and electrical measuring circuit means, said power supply control means including a power source, switch means connected between said power source and transducer means to selectively pass or block the flow of electrical power to said transducer means, control pulse producing means for providing spaced, sequential control pulses, the time between any two successive control pulses exceeding the maximum time required for said reference signal to reach the coincident point with said measurement signal and switch control means connected to receive said control pulses, said switch control means operating in response to a control pulse to cause said switch means to initiate the flow of power to said transducer means from said power source, said switch control means operating to cause said switch means to terminate the power flow to said transducer means upon the elapse of a time period after the receipt by said switch control means of a control pulse but before the receipt by said switch control means of the next succeeding control pulse.

24. The electronic measuring system of claim 23 wherein said comparison means operates when the reference signal reaches a concidence point with said measurement signal to cause said switch control means to operate said switch means to terminate power flow to said transducer means.

25. The electronic measuring system of claim 23 wherein said switch control means operates upon the expiration of a delay period after said switch means is caused thereby to initiate power flow to said transducer means to cause said reference generating means to initiate said reference signal.

26. The electronic measuring system of claim 25 wherein said reference generating means includes an integrator ramp generator means for generating linearly increasing ramp signals, said ramp generator means including a feedback capacitor connected between the input and output thereof to provide a capacitive feedback path for said integrator ramp generator means, and solid state switching means connected to selectively complete or block an electrical short circuit path around said feedback capacitor means, said switch control means operating upon the expiration of said delay period to terminate conduction of said solid state switching means to initiate said reference signal and again operating between the time when said reference signal reaches a coincidence point with said measurement signal and the occurrence of the next control pulse to cause conduction of said solid state switching means, said solid state switching means being operative when conducting to short out said feedback capacitor and place a feedback of unity across the ramp generator means to provide an effective zero reference for the beginning of the next ramp signal.

27. The electronic measuring system of claim 26 wherein said comparison means includes a single comparator means having a first input connected to receive the ramp signal from said ramp generator means and a second input connected to receive said electrical measurement signal, said single comparator means operating to provide an output indication when said ramp signal reaches a coincidence point with said electrical measurement signal.

28. The electronic measuring system of claim 27 wherein said single comparator means operates when the reference signal reaches a coincidence point with said measurement signal to cause said switch control means to operate said switch means to terminate power flow to said transducer means.

29. The electronic measuring system of claim 23 wherein said measuring circuit means includes automatic drift correction means operative in a first mode to store error signals present in said measuring circuit means when power flow to said transducer means is blocked by said switch means, said drift correction means operating in a second mode when power is provided to said transducer means to correct the electrical measurement signal to compensate for said error signals, said switch control means operating to cause said drift correction means to operate in said first mode upon initiation of the flow of power to said transducer means by said switch means and to operate in said second mode when said switch means terminates the flow of power to said transducer means.

30. The electronic measuring system of claim 29 wherein said measuring circuit means includes amplifier means connected to receive and amplify the electrical output signal from said transducer means, said drift correction means being connected between said amplifier means and comparison means and including a filter amplifier, a capacitive coupling means having an input side connected to said amplifier means and an output side connected to said filter amplifier, and drift control switch means operative to selectively connect the output side of said capacitive coupling means to an electrical ground, said switch control means operating to cause said drift control switch means to disconnect the output side of said capacitive coupling means from said electrical ground upon initiation of the flow of power to said transducer means by said switch means and to cause said drift control switch means to connect the output side of said capacitive coupling means to the electrical ground when said switch means terminates the flow of power to said transducer means.

31. The electronic measuring system of claim 25 wherein said measuring circuit means includes automatic drift correction means operative in a first mode to store error signals present in said measuring circuit means when power flow to said transducer means is blocked by said switch means, said drift correction means operating in a second mode when power is provided to said transducer means to correct the electrical measurement signal to compensate for said error signals, said switch control means operating to cause said drift correction means to operate in said first mode upon initiation of the flow of power to said transducer means by said switch means and to operate in said second mode when the switch means terminates the flow of power to said transducer means.

32. The electronic measuring system of claim 23 wherein said measuring circuit means includes stability sensing means connected to sense said electrical measurement signal, said stability sensing means operating in response to an unstable electrical measurement signal to cause said switch control means to operate to cause said switch means to terminate the flow of power to said transducer means.

33. The electronic measuring system of claim 32 wherein said control pulse producing means is operative in a first state to provide constant frequency control pulses of a first frequency and in a second state to provide constant frequency control pulses of a second frequency higher than said first frequency, said control pulse producing means being normally operable in said first state, the stability sensing means operating upon the stabilization of said electrical measurement signal from an unstable condition to cause said control pulse producing means to operate in said second state for a delay period and at the termination of such delay period to return said control pulse producing means to the first state.

34. The electronic measuring system of claim 25 wherein said measuring circuit means includes stability sensing means connected to sense said electrical measurement signal, said stability sensing means operating in response to an unstable electrical measurement signal to cause said switch control means to operate to cause said switch means to terminate the flow of power to said transducer means.

35. The electronic measuring system of claim 34 wherein said control pulse producing means is operative in a first state to provide constant frequency control pulses of a first frequency and in a second state to provide constant frequency control pulses of a second frequency higher than said first frequency, said control pulse producing means being normally operable in said first state, the stability sensing means operating upon the stabilization of said electrical measurement signal from an unstable condition to cause said control pulse producing means to operate in said second state for a delay period and at the termination of such delay period to return said control pulse producing means to the first state.

36. The electronic measuring system of claim 35 wherein said measuring circuit includes automatic drift correction means operative in a first mode to store error signals present in said measuring circuit means when power flow to said transducer means is blocked by said switch means, said drift correction means operating in a second mode when power is provided to said transducer means to correct the electrical measurement signal to compensate for said error signals, said switch control means operating to cause said drift correction means to operate in said first mode upon initiation of the flow of power to said transducer means by said switch means and to operate in said second mode when the switch means terminates the flow of power to said transducer means.

37. The electronic measuring system of claim 2 wherein said stability sensing means includes control signal generating means to receive said electrical measurement signal and operative in response to the rate of change of said electrical measurement signal, said control signal generating means including means to generate a reference signal, magnitude control means to receive said electrical measurement signal and provide an output signal of less magnitude than the magnitude of said reference signal when the rate of change of said electrical measurement signal is less than a predetermined rate, said magnitude control means providing an output signal of greater magnitude than said reference signal when the rate of change of said electrical measurement signal exceeds said predetermined rate, and comparison means connected to receive said reference signal and the output signal from said magnitude control means, said comparison means operating to provide a first output signal to said switching means when said reference signal exceeds the magnitude of the output signal from said magnitude control means and a second output signal to said switching means when the output signal from said magnitude control means exceeds the magnitude of said reference signal.

* * * * *